(12) United States Patent
Ohmaru et al.

(10) Patent No.: US 10,079,053 B2
(45) Date of Patent: Sep. 18, 2018

(54) MEMORY ELEMENT AND MEMORY DEVICE

(75) Inventors: Takuro Ohmaru, Zama (JP); Yukio Maehashi, Yokohama (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 380 days.

(21) Appl. No.: 13/444,177

(22) Filed: Apr. 11, 2012

(65) Prior Publication Data

US 2012/0271984 A1 Oct. 25, 2012

(30) Foreign Application Priority Data

Apr. 22, 2011 (JP) .................................. 2011-096609
May 19, 2011 (JP) .................................. 2011-112693

(51) Int. Cl.
*G11C 14/00* (2006.01)
*G11C 11/412* (2006.01)

(52) U.S. Cl.
CPC ........ *G11C 11/412* (2013.01); *G11C 14/0054* (2013.01)

(58) Field of Classification Search
CPC ... G11C 14/0054; G11C 11/412; G11C 14/00; G11C 14/0072
USPC ........................................ 365/149, 154, 188
See application file for complete search history.

(56) References Cited

U.S. PATENT DOCUMENTS

| 4,809,225 | A | 2/1989 | Dimmler et al. |
| 5,528,032 | A | 6/1996 | Uchiyama |
| 5,610,856 | A | 3/1997 | Yoshizumi et al. |
| 5,731,856 | A | 3/1998 | Kim et al. |

(Continued)

FOREIGN PATENT DOCUMENTS

| EP | 0297777 | A | 1/1989 |
| EP | 0530928 | A | 3/1993 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

(Continued)

*Primary Examiner* — Douglas King
(74) *Attorney, Agent, or Firm* — Robinson Intellectual Property Law Office; Eric J. Robinson

(57) ABSTRACT

An object is to provide a memory element having a novel structure where data can be held even after power supply is stopped. The memory element includes a latch circuit, a first selection circuit, a second selection circuit, a first nonvolatile memory circuit, and a second nonvolatile memory circuit. The first nonvolatile memory circuit and the second nonvolatile memory circuit each include a transistor and a capacitor. The transistor included in each of the first nonvolatile memory circuit and the second nonvolatile memory circuit is a transistor in which a channel is formed in an oxide semiconductor film. The off-state current of such a transistor is extremely small. The transistor is turned off after data is input to a node where the transistor and the capacitor are connected to each other, and data can be held for a long time even after supply of power supply voltage is stopped.

8 Claims, 28 Drawing Sheets

(56) References Cited

U.S. PATENT DOCUMENTS

| | | | |
|---|---|---|---|
| 5,744,864 A | 4/1998 | Cillessen et al. | |
| 6,285,575 B1* | 9/2001 | Miwa | 365/145 |
| 6,294,274 B1 | 9/2001 | Kawazoe et al. | |
| 6,563,174 B2 | 5/2003 | Kawasaki et al. | |
| 6,625,056 B1 | 9/2003 | Kihara | |
| 6,707,702 B1* | 3/2004 | Komatsuzaki | 365/145 |
| 6,727,522 B1 | 4/2004 | Kawasaki et al. | |
| 6,730,950 B1* | 5/2004 | Seshadri | H01L 21/76895 257/295 |
| 6,731,530 B2* | 5/2004 | Miwa et al. | 365/145 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,292,490 B1* | 11/2007 | Shu | G11C 11/406 365/222 |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,663,165 B2 | 2/2010 | Mouli | |
| 7,674,650 B2 | 3/2010 | Akimoto et al. | |
| 7,732,819 B2 | 6/2010 | Akimoto et al. | |
| 7,894,296 B2 | 2/2011 | Lee et al. | |
| 8,084,331 B2 | 12/2011 | Ofuji et al. | |
| 8,314,637 B2 | 11/2012 | Kato et al. | |
| 8,324,621 B2 | 12/2012 | Yamazaki et al. | |
| 8,389,417 B2 | 3/2013 | Yamazaki et al. | |
| 8,410,838 B2 | 4/2013 | Kato et al. | |
| 8,432,187 B2 | 4/2013 | Kato et al. | |
| 8,470,648 B2 | 6/2013 | Yamazaki et al. | |
| 8,633,872 B2 | 1/2014 | Osame | |
| 8,987,728 B2 | 3/2015 | Honda et al. | |
| 9,012,905 B2 | 4/2015 | Yamazaki | |
| 9,093,538 B2 | 7/2015 | Yamazaki | |
| 9,478,668 B2 | 10/2016 | Takahashi et al. | |
| 2001/0046027 A1 | 11/2001 | Tai et al. | |
| 2002/0036944 A1* | 3/2002 | Fujimoto | 365/230.03 |
| 2002/0056838 A1 | 5/2002 | Ogawa | |
| 2002/0132454 A1 | 9/2002 | Ohtsu et al. | |
| 2003/0162394 A1 | 8/2003 | Takemura | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0080972 A1 | 4/2004 | Seshadri et al. | |
| 2004/0127038 A1 | 7/2004 | Carcia et al. | |
| 2004/0155281 A1 | 8/2004 | Osada et al. | |
| 2005/0017302 A1 | 1/2005 | Hoffman | |
| 2005/0073876 A1* | 4/2005 | Chen et al. | 365/154 |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0171713 A1* | 7/2007 | Hunter et al. | 365/185.07 |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0246767 A1 | 10/2007 | Osada et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1* | 3/2008 | Iwasaki | 257/79 |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0050941 A1* | 2/2009 | Yamazaki | H01L 21/76254 257/255 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0152607 A1 | 6/2009 | Tanaka et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0182223 A1 | 7/2010 | Choi et al. | |
| 2011/0102019 A1 | 5/2011 | Osada et al. | |
| 2011/0254095 A1* | 10/2011 | Kamata et al. | 257/368 |
| 2012/0032172 A1 | 2/2012 | Noda et al. | |
| 2012/0033483 A1* | 2/2012 | Koyama | G11C 11/405 365/149 |

FOREIGN PATENT DOCUMENTS

| | | |
|---|---|---|
| EP | 1341219 A | 9/2003 |
| EP | 1414046 A | 4/2004 |
| EP | 1737044 A | 12/2006 |
| EP | 1777689 A | 4/2007 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 64-066899 A | 3/1989 |
| JP | 03-131065 A | 6/1991 |
| JP | 05-251705 A | 9/1993 |
| JP | 06-275697 | 9/1994 |
| JP | 08-250605 A | 9/1996 |
| JP | 08-264794 A | 10/1996 |

(56) References Cited

FOREIGN PATENT DOCUMENTS

| | | |
|---|---|---|
| JP | 09-186251 | 7/1997 |
| JP | 11-505377 | 5/1999 |
| JP | 2000-044236 A | 2/2000 |
| JP | 2000-150900 A | 5/2000 |
| JP | 2000-293989 A | 10/2000 |
| JP | 2002-076356 A | 3/2002 |
| JP | 2002-289859 A | 10/2002 |
| JP | 2002-304889 A | 10/2002 |
| JP | 2003-086000 A | 3/2003 |
| JP | 2003-086808 A | 3/2003 |
| JP | 2003-258202 A | 9/2003 |
| JP | 2004-103957 A | 4/2004 |
| JP | 2004-146048 A | 5/2004 |
| JP | 2004-207694 A | 7/2004 |
| JP | 2004-273614 A | 9/2004 |
| JP | 2004-273732 A | 9/2004 |
| JP | 2009-076879 A | 4/2009 |
| JP | 2009-152235 A | 7/2009 |
| JP | 2009-212443 A | 9/2009 |
| JP | 2009-535819 | 10/2009 |
| JP | 2010-141143 A | 6/2010 |
| JP | 2010-267704 A | 11/2010 |
| KR | 2000-0071586 A | 11/2000 |
| KR | 10-0506338 | 8/2005 |
| KR | 2007-0042458 A | 4/2007 |
| WO | WO-2004/114391 | 12/2004 |
| WO | WO-2008/027392 | 3/2008 |
| WO | WO-2009/110623 | 9/2009 |
| WO | WO-2011/046003 | 4/2011 |

OTHER PUBLICATIONS

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

(56) References Cited

OTHER PUBLICATIONS

Park.S et al., "Challenge to Future Displays: Transparent AM-OLED Driven by Peald Grown ZNO TFT,", IMID '07 Digest, 2007, pp. 1249-1252.
Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.
Osada.T et al., "Development of Driver-Integrated Panel Using Amorphous In—Ga—Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N. et al., "Spinel,YbFe2O4, and Yb2Fe3O7 Types of Structures for Compounds in the In2O3 and Sc2O3—A2O3—BO Systems [a; Fe, Ga, or Al; B: Mg, Mn, Fe, Ni, Cu.,or Zn] at Temperatures Over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m <4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.
Taiwanese Office Action (Application No. 101113498), dated Apr. 29, 2016.
Korean Office Action (Application No. 2012-0041434) dated Jul. 16, 2018.

\* cited by examiner

FIG. 13A
FIG. 13B
FIG. 13C
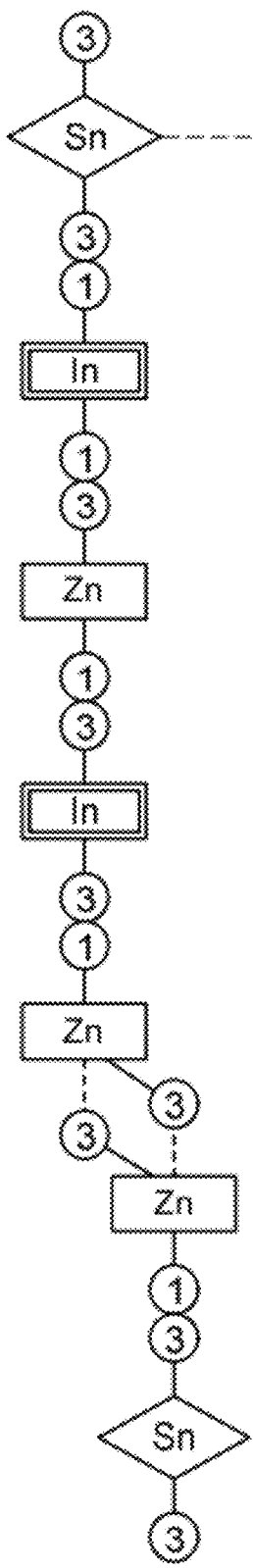
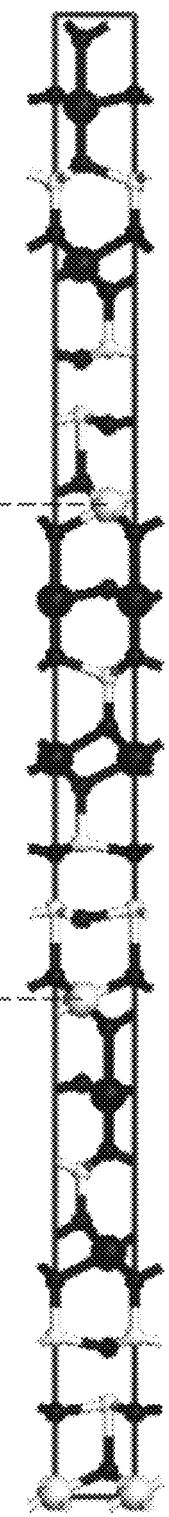
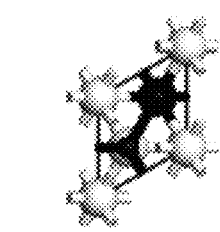
● In
◯ Sn
◇ Zn
● O

● In
○ Ga
○ Zn
● O

MEMORY ELEMENT AND MEMORY DEVICE

BACKGROUND OF THE INVENTION

1. Field of the Invention

The present invention relates to a memory device utilizing a memory element, and a manufacturing method thereof.

2. Description of the Related Art

In recent years, with the widespread use of electronic devices such as personal computers and mobile phones, demand for higher performance of electronic devices has been increased. In order to achieve higher performance of such electronic devices, higher integration and larger capacity of memories have been particularly required in addition to higher-speed operation of memories and interfaces, improvement in processing performance of external devices, and the like.

The "memory" used here includes, in its category, not only a main memory for storing data and program but also a register, a cache memory, and the like used in a microprocessor unit (MPU). A register is provided to temporarily hold data for carrying out arithmetic processing, holding a program execution state, or the like. In addition, a cache memory is located between an arithmetic circuit and a main memory in order to reduce low-speed access to the main memory and speed up the arithmetic processing. In a memory device such as a register or a cache memory, writing of data needs to be performed at higher speed than in a main memory. Thus, in general, a flip-flop or the like is used as a register, and a static random access memory (SRAM) or the like is used as a cache memory.

A memory cell (also referred to as memory element) in an SRAM includes a latch circuit which stores one-bit data and two access transistors (nMOSFETs). The latch circuit includes a pair of driver transistors (nMOSFETs) and a pair of load transistors (pMOSFETs). In the SRAM, such memory cells are arranged in a matrix, and the potentials of a word line and a bit line are controlled so that data reading, data writing, and data erasing are performed for a specific memory cell.

The SRAM stores data using the operation state of a latch to which power is continuously supplied (i.e., which of a pair of cross-connected transistors is on/off state). Unlike a DRAM, the SRAM does not need refresh operation; thus, the SRAM consumes only a minimum amount of power supply current necessary for holding the operation state of the latch circuit. However, with miniaturization of SRAMs, a problem of an increase in power consumption due to leakage current arises. For example, it has been reported that the use of a pair of capacitors instead of a pair of load transistors leads to a reduction in power consumption (Patent Document 1). However, along with a further increase in capacity of memories, an increase in power consumption due to leakage current might be caused.

Furthermore, since the SRAM is volatile, data is lost when power supply is stopped; therefore, an additional memory device using a magnetic material or an optical material is needed in order to hold data for a long time. In recent years, attention has been directed to, as one measure to conserve energy, a normally-off computer in which data is not lost even after power supply is stopped and which returns to an operation mode shortly after power is turned on. It is essential to achieve higher performance of a nonvolatile logic and a nonvolatile memory.

REFERENCE

Patent Document

[Patent Document 1] Japanese Published Patent Application No. H9-186251

SUMMARY OF THE INVENTION

In view of the above problems, an object of one embodiment of the present invention is to provide a memory element whose power consumption due to leakage current is reduced. Another object is to provide a memory element which is capable of holding data even after power supply is stopped. Another object is to provide a memory element whose power consumption is reduced by stopping power supply.

A memory element according to one embodiment of the present invention includes a latch circuit, a first selection circuit, a second selection circuit, a first nonvolatile memory circuit, and a second nonvolatile memory circuit.

Specifically, one embodiment of the present invention is a memory element including a first selection circuit outputting a first data signal in response to a first control signal; a second selection circuit outputting a second data signal that is an inverted signal of the first data signal in response to the first control signal; a latch circuit to which the first data signal and the second data signal are input and which holds the first data signal and the second data signal only in a period during which a power supply voltage is supplied; a first nonvolatile memory circuit to which the first data signal held in the latch circuit is input in response to a second control signal; and a second nonvolatile memory circuit to which the second data signal held in the latch circuit is input in response to the second control signal. The first nonvolatile memory circuit holds the first data signal and the second nonvolatile memory circuit holds the second data signal even after supply of the power supply voltage is stopped.

The first nonvolatile memory circuit includes a first transistor and a first capacitor. The second nonvolatile memory circuit includes a second transistor and a second capacitor.

Here, a transistor in which a channel is formed in an oxide semiconductor film is used as each of the first transistor and the second transistor. Such a transistor has a characteristic of extremely small off-state current compared to a transistor in which a channel is formed in a crystalline silicon film. The first transistor is turned off after data is input to a node where the first transistor and the first capacitor are connected to each other, and data can be held for a long time even after supply of power supply voltage is stopped. That is, the memory element can serve as a nonvolatile memory element. Similarly, the second transistor is turned off after data is input to a node where the second transistor and the second capacitor are connected to each other, and data can be held for a long time even after supply of power supply voltage is stopped.

In order to read data from the memory element, the following is performed: supply of a power supply potential to the latch circuit is started, so that data read from the first nonvolatile memory circuit may be transmitted to the first selection circuit through the latch circuit and data read from the second nonvolatile memory circuit may be transmitted to the second selection circuit through the latch circuit.

The latch circuit can be formed using at least two transistors. Each of the first selection circuit and the second selection circuit can be formed using at least one transistor.

A transistor in which a channel is formed in a film including a semiconductor other than an oxide semiconductor can be employed as transistors used in the latch circuit, the first selection circuit, and the second selection circuit. As a semiconductor material other than an oxide semiconductor, for example, a semiconductor material belonging to Group 14 of the periodic table can be used.

The transistors used in the latch circuit, the first selection circuit, and the second selection circuit may be n-channel transistors or p-channel transistors. In one embodiment of the present invention, p-channel transistors are employed as the transistors used in the latch circuit. In the case where one transistor is used in each of the first selection circuit and the second selection circuit, an n-channel transistor is employed in each of the circuits. In the case where two transistors are used in each of the first selection circuit and the second selection circuit, an n-channel transistor and a p-channel transistor are preferably used in combination in each of the circuits.

With the use of one or a plurality of memory elements according to one embodiment of the present invention, a memory device can be manufactured.

According to one embodiment of the present invention, a memory element whose power consumption due to leakage current is reduced can be provided. Further, a memory element which is capable of holding data even after power supply is stopped can be provided. Furthermore, a memory element whose power consumption is reduced by stopping power supply can be provided.

BRIEF DESCRIPTION OF THE DRAWINGS

FIGS. 13A to 13C illustrate a structure of an oxide material according to one embodiment of the present invention.

DETAILED DESCRIPTION OF THE INVENTION

Figure 1:
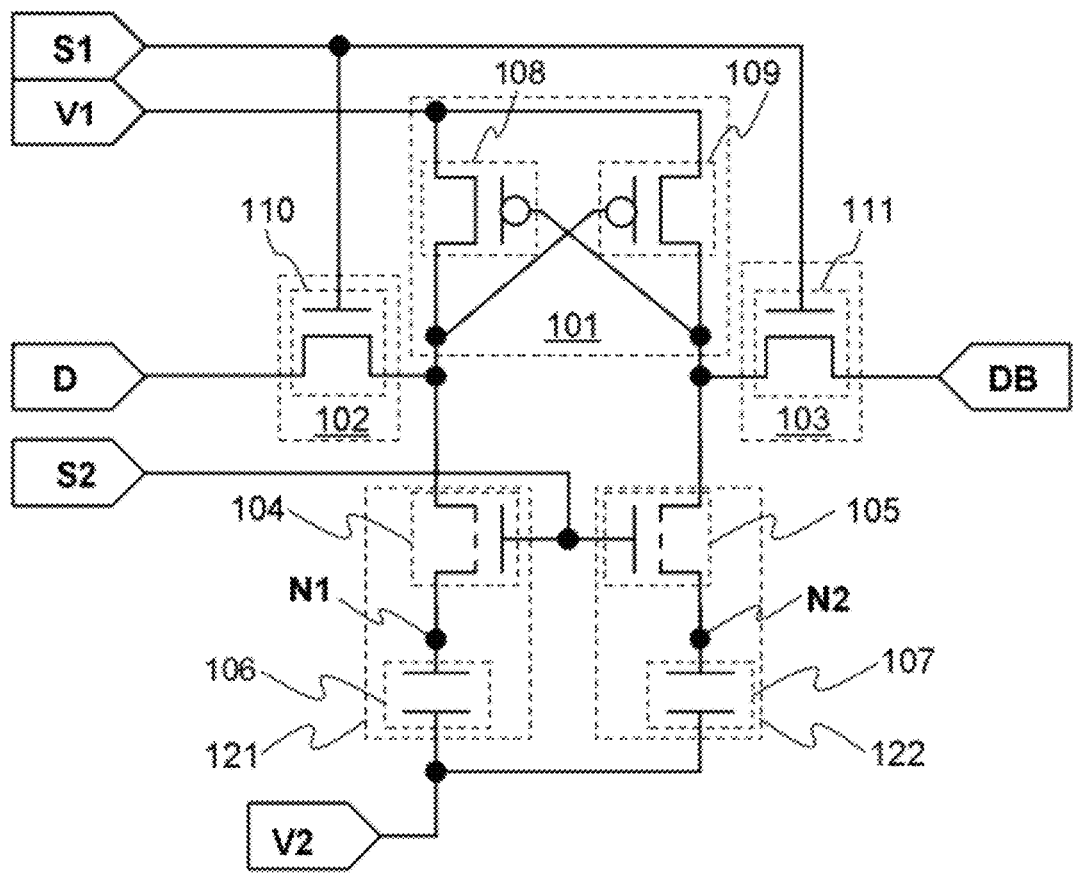
FIG. 1 is a circuit diagram of a memory element.

Hereinafter, embodiments of the present invention will be described in detail with reference to the accompanying drawings. Note that the present invention is not limited to the following description and it will be readily appreciated by those skilled in the art that the modes and details of the present invention can be modified in various ways without departing from the spirit and scope thereof. Therefore, the present invention should not be interpreted as being limited to the description in the following embodiments.

Note that functions of the "source" and "drain" may be switched in the case where transistors of different polarities are employed or in the case where the direction of a current flow changes in a circuit operation, for example. Therefore, the terms "source" and "drain" can be used to denote the drain and the source, respectively, in this specification.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

Ordinal numbers such as "first", "second", and "third" are used in order to avoid confusion among components.

Embodiment 1

In this embodiment, a memory element according to one embodiment of the present invention will be described with reference to FIG. 1, FIG. 2, FIG. 3, and FIG. 4.

<Structure of Memory Element>

FIG. 1 illustrates an example of a memory element according to one embodiment of the present invention. A memory element 100 in FIG. 1 includes a latch circuit 101, a selection circuit 102, a selection circuit 103, a first nonvolatile memory circuit 121, and a second nonvolatile memory circuit 122.

The latch circuit 101 includes a transistor 108 and a transistor 109. A first terminal of the latch circuit 101 corresponds to one of a source and a drain of the transistor 108, a second terminal thereof corresponds to one of a source and a drain of the transistor 109, and a third terminal thereof corresponds to the other of the source and the drain of the transistor 108 (or the other of the source and the drain of the transistor 109). A gate of the transistor 108 is connected to the one of the source and the drain of the transistor 109, a gate of the transistor 109 is connected to the one of the source and the drain of the transistor 108, and the other of the source and the drain of the transistor 108 is connected to the other of the source and the drain of the transistor 109. A power potential V1 is applied to the third terminal of the latch circuit 101.

The selection circuit 102 includes a transistor 110. A first terminal of the selection circuit 102 corresponds to one of a source and a drain of the transistor 110, a second terminal thereof corresponds to the other of the source and the drain of the transistor 110, and a third terminal thereof corresponds to a gate of the transistor 110. The first terminal of the selection circuit 102 is connected to the first terminal of the latch circuit 101. A data line D is connected to the second terminal of the selection circuit 102. A signal input to the data line D has either a high-level potential or a low-level potential.

The selection circuit 103 includes a transistor 111. A first terminal of the selection circuit 103 corresponds to one of a source and a drain of the transistor 111, a second terminal thereof corresponds to the other of the source and the drain of the transistor 111, and a third terminal thereof corresponds to a gate of the transistor 111. The first terminal of the selection circuit 103 is connected to the first terminal of the latch circuit 101. A data line DB is connected to the second terminal of the selection circuit 103. A signal input to the data line DB has either a high-level potential or a low-level potential. To the data line DB, an inverted signal of a signal input to the data line D is input.

A control signal S1 is input to the third terminal of the selection circuit 102 and the third terminal of the selection circuit 103. When the control signal S1 is input to the third terminal of the selection circuit 102, conduction or non-conduction between the first terminal and the second terminal (on/off state of the transistor 110) is selected. Similarly, when the control signal S1 is input to the third terminal of the selection circuit 103, conduction or non-conduction between the first terminal and the second terminal (on/off state of the transistor 111) is selected.

The first nonvolatile memory circuit 121 includes a transistor 104 and a capacitor 106. A first terminal of the first nonvolatile memory circuit 121 corresponds to one of a source and a drain of the transistor 104, a second terminal thereof corresponds to one of a pair of electrodes of the capacitor 106, and a third terminal thereof corresponds to a gate of the transistor 104. Here, the one of the source and the drain of the transistor 104 is connected to the first terminal of the latch circuit 101, and the other of the source and the drain of the transistor 104 is connected to the other of the pair of electrodes of the capacitor 106. Here, a point where the transistor 104 and the capacitor 106 are connected to each other is referred to as a node N1.

The second nonvolatile memory circuit 122 includes a transistor 105 and a capacitor 107. A first terminal of the second nonvolatile memory circuit 122 corresponds to one of a source and a drain of the transistor 105, a second terminal thereof corresponds to one of a pair of electrodes of the capacitor 107, and a third terminal thereof corresponds to a gate of the transistor 105. Here, the one of the source and the drain of the transistor 105 is connected to the second terminal of the latch circuit 101, and the other of the source and the drain of the transistor 105 is connected to the other of the pair of electrodes of the capacitor 107. Here, a point where the transistor 105 and the capacitor 107 are connected to each other is referred to as a node N2.

The second terminal of the first nonvolatile memory circuit 121 is connected to the second terminal of the second nonvolatile memory circuit 122. That is, the one of the pair of electrodes of the capacitor 106 is connected to the one of the pair of electrodes of the capacitor 107. A potential V2 is applied to the one of the pair of electrodes of the capacitor 106 and the one of the pair of electrodes of the capacitor 107.

The third terminal of the first nonvolatile memory circuit 121 and the third terminal of the second nonvolatile memory circuit 122 are connected to each other. That is, the gate of the transistor 104 and the gate of the transistor 105 are connected to each other. A control signal S2 is input to the gate of the transistor 104 and the gate of the transistor 105.

Here, the transistor 104 and the transistor 105 are each a transistor in which a channel is formed in an oxide semiconductor film. As an oxide semiconductor material, for example, an In—Ga—Zn—O-based oxide semiconductor material can be used. In a transistor whose channel is formed in an oxide semiconductor film that is highly purified by reducing an impurity such as hydrogen or water, the off-state current density can be 100 zA/μm or lower, preferably 10 zA/μm or lower. This value of off-state current density is quite lower than the off-state current density of a transistor in which a channel is formed in a crystalline silicon film. Accordingly, in the case where the transistor 104 is off, the potential of the node N1 can be held for a long time. Similarly, in the case where the transistor 105 is off, the potential of the node N2 can be held for a long time. Further, power consumption of the memory element 100 can be reduced.

On the other hand, the transistor 108, the transistor 109, the transistor 110, and the transistor 111 are each a transistor in which a channel is formed in a film including a semiconductor other than an oxide semiconductor. As a semiconductor material other than an oxide semiconductor, for example, a semiconductor material belonging to Group 14 of the periodic table can be used. Each of the transistors 108, 109, 110, and 111 is either an n-channel transistor or a p-channel transistor. In this embodiment, the transistors 108 and 109 are p-channel transistors and the transistors 110 and 111 are n-channel transistors.

<Driving Method of Memory Element>

Figure 2:
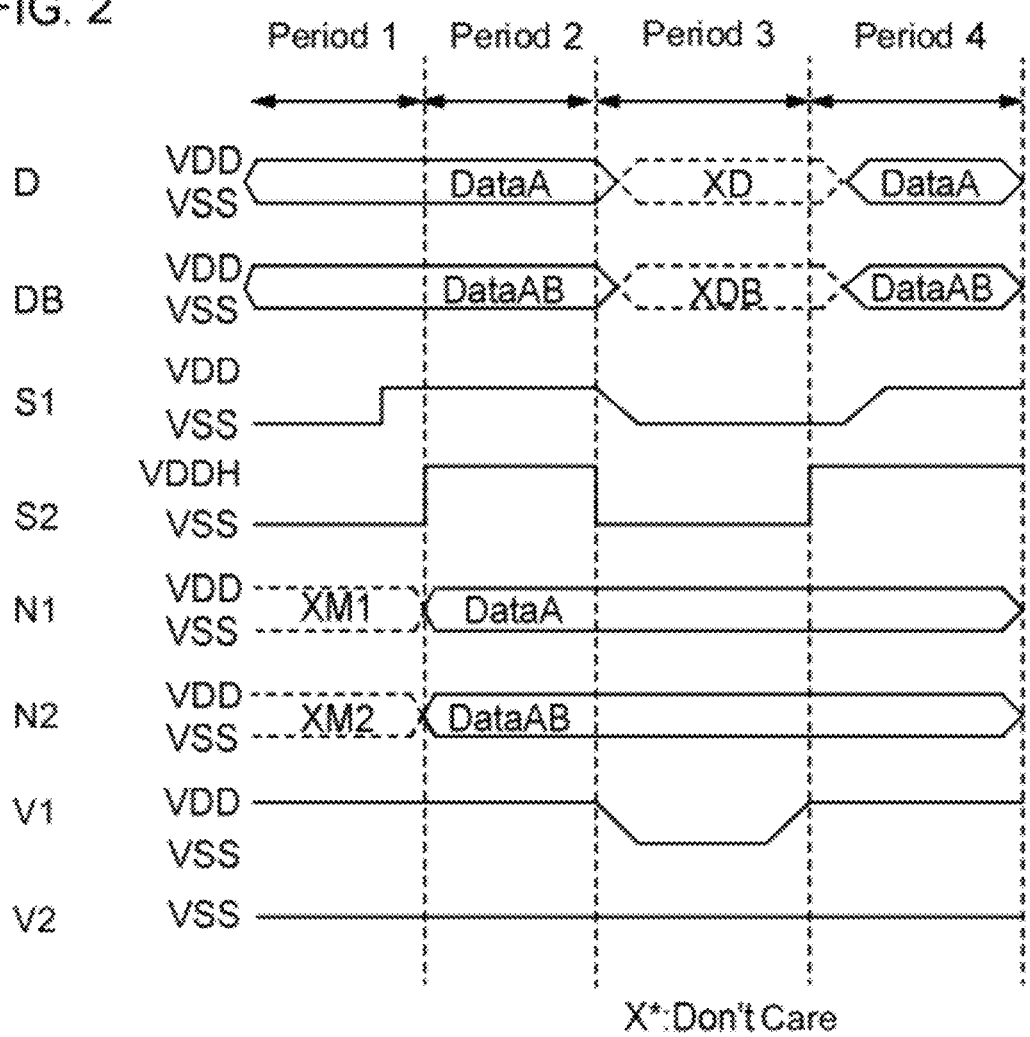
FIG. 2 is a timing chart showing operation of a memory element.

Next, a driving method of the memory element in FIG. 1 will be described with reference to FIG. 2. FIG. 2 is a timing chart of the memory element in FIG. 1.

Methods of writing data to the memory element, stopping supply of power supply voltage to the memory element, and reading data from the memory element will be described with reference to FIG. 1 and FIG. 2. In the timing chart of FIG. 2, D represents the potential of the data line D, DB represents the potential of the data line DB, S1 represents the potential of the control signal S1, S2 represents the potential of the control signal S2, N1 represents the potential of the node N1, N2 represents the potential of the node N2, V1 represents the potential V1, and V2 represents the potential V2.

Period 1 is a period during which the memory element is non-active. In Period 1, a high-level potential (e.g., VDD) is input as the potential V1 to the third terminal of the latch circuit 101 (the other of the source and the drain of the transistor 108 and the other of the source and the drain of the transistor 109). A low-level potential (e.g., VSS) is input as the potential V2 to the one of the pair of electrodes of the capacitor 106 and the one of the pair of electrodes of the capacitor 107. In this case, DataA is input to the second terminal of the selection circuit 102, and DataAB is input to the second terminal of the selection circuit 103. Here, a description is given on the assumption that DataA has a high-level potential (e.g., VDD) and DataAB has a low-level potential (e.g., VSS).

Next, a high-level potential (e.g., VDD) is input as the control signal S1 to the third terminal of the selection circuit 102 and the third terminal of the selection circuit 103, whereby electrical continuity is established between the first terminal and the second terminal of the selection circuit 102 and between the first terminal and the second terminal of the selection circuit 103.

When electrical continuity is established between the first terminal and the second terminal of the selection circuit 102, DataA is output from the first terminal of the selection circuit 102. Accordingly, a high-level potential (VDD) is input to the gate of the transistor 109, so that the transistor 109 is turned off. Further, when electrical continuity is established between the first terminal and the second terminal of the selection circuit 103, DataAB is output from the first terminal of the selection circuit 103. Accordingly, a low-level potential (VSS) is input to the gate of the transistor 108, so that the transistor 108 is turned on.

When electrical continuity is established between the first terminal and the second terminal of the selection circuit 102 and the transistor 108 is turned on, a high-level potential is input to the first terminal of the latch circuit 101. That is, DataA is held in the first terminal of the latch circuit 101. Further, when electrical continuity is established between the first terminal and the second terminal of the selection circuit 103 and the transistor 109 is turned off, a low-level potential is input to the second terminal of the latch circuit 101. That is, DataAB is held in the second terminal of the latch circuit 101.

When electrical continuity is established between the first terminal and the second terminal of the selection circuit 102 and the transistor 108 is turned on, the potential of the first terminal of the latch circuit 101 can be determined quickly. Similarly, when electrical continuity is established between the first terminal and the second terminal of the selection circuit 103 and the transistor 109 is turned on, the potential of the second terminal of the latch circuit 101 can be determined quickly. That is, data can be written to the latch circuit 101.

Period 2 is a period for writing data to the memory element. In Period 2, a high-level potential (e.g., VDDH which is a voltage higher than VDD by the threshold voltage of the transistor 104 or the transistor 105) is input as the control signal S2 to the gate of the transistor 104 and the gate of the transistor 105, so that the transistor 104 and the transistor 105 are turned on. Consequently, the potential (VDD) of the first terminal of the latch circuit 101 is input to the node N1, and the potential (VSS) of the second terminal of the latch circuit 101 is input to the node N2. In other words, DataA held in the first terminal of the latch circuit 101 is input to the node N1, and DataAB held in the second terminal of the latch circuit 101 is input to the node N2.

Period 3 is a period for stopping supply of power supply voltage to the memory element. In Period 3, first, a low-level potential (e.g., VSS) is input as the control signal S2 to the gate of the transistor 104 and the gate of the transistor 105, so that the transistor 104 and the transistor 105 are turned off. Next, a low-level potential (e.g., VSS) is input as the potential V1 to the third terminal of the latch circuit 101. Accordingly, supply of power supply voltage to the memory element is stopped. The potential VSS is input as the control signal S1 to the third terminal of the selection circuit 102 and the third terminal of the selection circuit 103, whereby electrical discontinuity is established between the first terminal and the second terminal of the selection circuit 102 and between the first terminal and the second terminal of the selection circuit 103.

Here, if the potential V1 or the control signal S1 is changed to VSS before the transistor 104 and the transistor 105 are turned off, the potential (DataA) held in the node N1 or the potential (DataAB) held in the node N2 might fluctuate. In addition, held data might be lost due to the following reasons: data is read out through the selection circuit 102 or the selection circuit 103; and the on/off state of each of the transistor 108 and the transistor 109 changed. Therefore, it is preferable that the potential V1 and the control signal S1 be each changed to the low-level potential after the transistor 104 and the transistor 105 are turned off.

Since the potential V1 and the control signal S1 are each changed to the low-level potential, the potentials of the first terminal and the second terminal of the latch circuit 101 cannot be held. That is, DataA held in the first terminal of the latch circuit 101 and DataAB held in the second terminal of the latch circuit 101 cannot be held.

In one embodiment of the present invention, a transistor in which a channel is formed in an oxide semiconductor film is used as each of the transistor 104 and the transistor 105. Such a transistor has a characteristic of extremely small off-state current. Therefore, even when the transistor 104 and the transistor 105 are off, a potential held by the capacitor 106 (potential of the node N1) and a potential held by the capacitor 107 (potential of the node N2) can be held for a long time. That is, after supply of the power supply voltage is stopped, the potential (DataA) held in the first terminal of the latch circuit 101 can be held in the node N1, and the potential (DataAB) held in the second terminal of the latch circuit 101 can be held in the node N2.

Next, a high-level potential (VDD) is input as the potential V1 to the third terminal of the latch circuit 101 to start supply of the power supply voltage.

Period 4 is a period for reading data from the memory element. In Period 4, the high-level potential (VDDH) is input as the control signal S2 to the gate of the transistor 104 and the gate of the transistor 105, so that the transistor 104 and the transistor 105 are turned on. Next, the high-level potential (VDD) is input as the control signal S1 to the third terminal of the selection circuit 102 and the third terminal of the selection circuit 103, whereby electrical continuity is established between the first terminal and the second terminal of the selection circuit 102 and between the first terminal and the second terminal of the selection circuit 103.

Accordingly, the potential of the first terminal of the latch circuit 101 can be returned to the potential (DataA) held in the node N1, and the potential of the second terminal of the latch circuit 101 can be returned to the potential (DataAB) held in the node N2. Further, DataA held in the node N1 and DataAB held in the node N2 can be read out through the selection circuit 102 and the selection circuit 103, respectively.

<Another Structure of Memory Element>

Next, another example of a memory element according to one embodiment of the present invention will be described with reference to FIG. 3.

Figure 3:
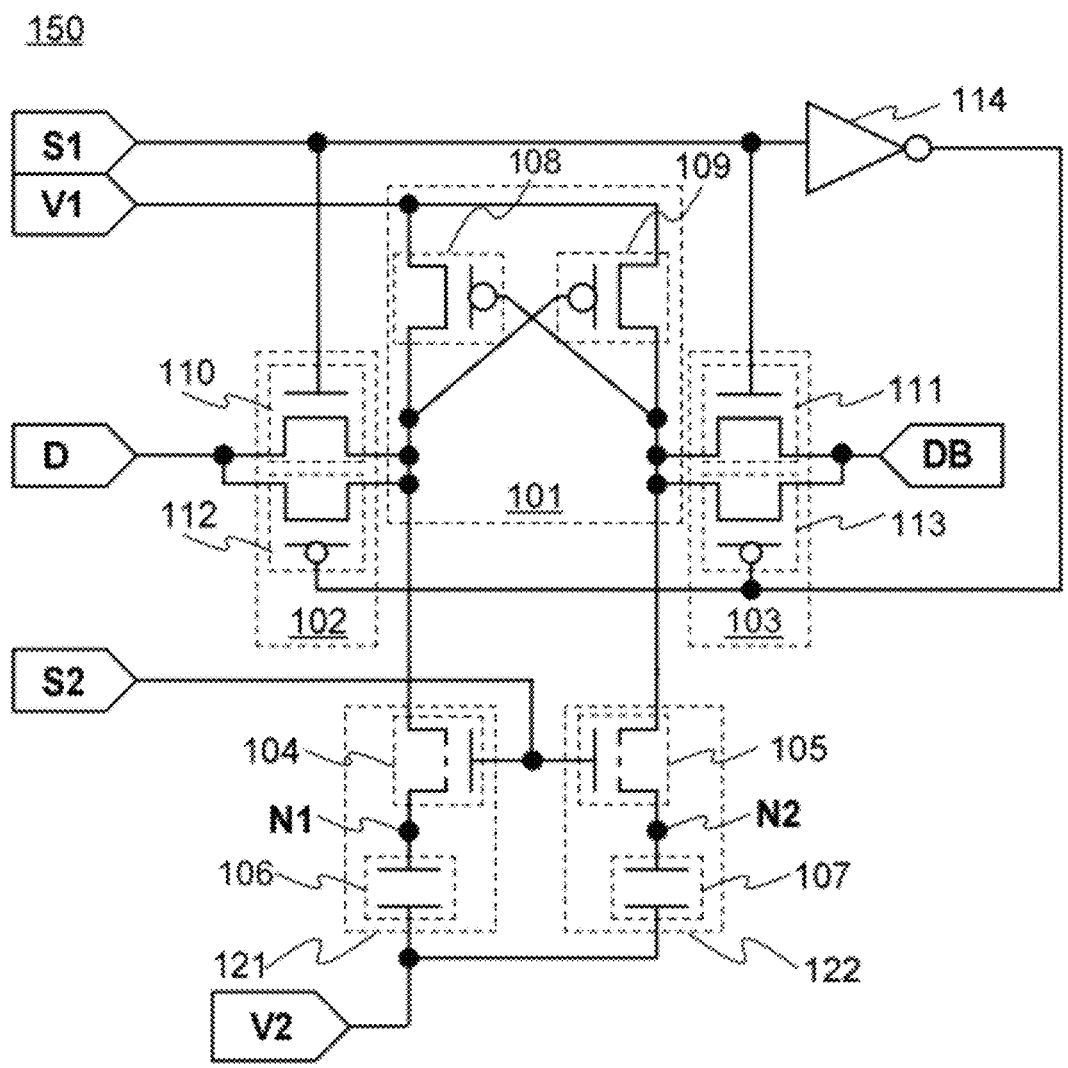
FIG. 3 is a circuit diagram of a memory element.

A memory element 150 in FIG. 3 includes the latch circuit 101, the selection circuit 102, the selection circuit 103, the transistor 104, the transistor 105, the capacitor 106, the capacitor 107, and an inverter 114.

In the memory element in FIG. 3, the selection circuit 102 includes the transistor 110 and a transistor 112. A first terminal of the selection circuit 102 corresponds to one of a source and a drain of the transistor 110 and one of a source and a drain of the transistor 112, a second terminal thereof corresponds to the other of the source and the drain of the transistor 110 and the other of the source and the drain of the transistor 112, a third terminal thereof corresponds to a gate of the transistor 110, and a fourth terminal thereof corresponds to a gate of the transistor 112. The one of the source and the drain of the transistor 110 and the one of the source and the drain of the transistor 112 are connected to a first terminal of the latch circuit 101. The other of the source and the drain of the transistor 110 is connected to the other of the source and the drain of the transistor 112.

The selection circuit 103 includes the transistor 111 and a transistor 113. A first terminal of the selection circuit 103 corresponds to one of a source and a drain of the transistor 111 and one of a source and a drain of the transistor 113, a second terminal thereof corresponds to the other of the source and the drain of the transistor 111 and the other of the source and the drain of the transistor 113, a third terminal thereof corresponds to a gate of the transistor 111, and a fourth terminal thereof corresponds to a gate of the transistor 113. The one of the source and the drain of the transistor 111 and the one of the source and the drain of the transistor 113 are connected to a second terminal of the latch circuit 101. The other of the source and the drain of the transistor 111 is connected to the other of the source and the drain of the transistor 113.

A control signal S1 is input to the gate of the transistor 110 and the gate of the transistor 111. From an output terminal of the inverter 114, an inverted signal of the control signal S1 is input to the gate of the transistor 112 and the gate of the transistor 113. When the control signal S1 is input to the gate of the transistor 110, the on/off state of the transistor 110 is selected; when the control signal S1 is input to the gate of the transistor 111, the on/off state of the transistor 111 is selected. Similarly, when the inverted signal of the control signal S1 is input to the gate of the transistor 112, the on/off state of the transistor 112 is selected; when the inverted signal of the control signal S1 is input to the gate of the transistor 113, the on/off state of the transistor 113 is selected.

Here, like the transistor 110 and the like, the transistor 112 and the transistor 113 are each a transistor in which a channel is formed in a film including a semiconductor other than an oxide semiconductor. Each of the transistor 112 and the transistor 113 is either an n-channel transistor or a p-channel transistor. In this embodiment, the transistor 112 and the transistor 113 are p-channel transistors.

<Driving Method of Memory Element>

Next, a driving method of the memory element 150 in FIG. 3 will be described with reference to FIG. 2.

In Period 1, a high-level potential is input as a potential V1 to the third terminal of the latch circuit 101 (the other of the source and the drain of the transistor 108 and the other of the source and the drain of the transistor 109). A low-level potential is input as a potential V2 to the one of the pair of electrodes of the capacitor 106 and the one of the pair of electrodes of the capacitor 107. Here, DataA is input to the second terminal of the selection circuit 102 (the other of the source and the drain of the transistor 110 and the other of the source and the drain of the transistor 112), and DataAB is input to the second terminal of the selection circuit 103 (the other of the source and the drain of the transistor 111 and the other of the source and the drain of the transistor 113). Here, a description is given on the assumption that DataA has a high-level potential and DataAB has a low-level potential.

Next, a high-level potential is input as the control signal S1 to the third terminal of the selection circuit 102 (the gate of the transistor 110) and the third terminal of the selection circuit 103 (the gate of the transistor 111), so that the transistor 110 and the transistor 111 are turned on. Further, since the control signal S1 is inverted by the inverter 114, the inverted signal (low-level potential) of the control signal S1 is input to the fourth terminal of the selection circuit 102 (the gate of the transistor 112) and the fourth terminal of the selection circuit 103 (the gate of the transistor 113). Accordingly, the transistor 112 and the transistor 113 are turned on.

Since the transistor 110 and the transistor 112 are turned on, a high-level potential is input to a gate of the transistor 109, so that the transistor 109 is turned off. Further, since the transistor 111 and the transistor 113 are turned on, a low-level potential is input to a gate of the transistor 108, so that the transistor 108 is turned on.

At this time, the potential of the first terminal of the latch circuit 101 is determined by the transistor 110 or the transistor 112, which is turned on sooner in the selection circuit 102. Similarly, the potential of the second terminal of the latch circuit 101 is determined by the transistor 111 or the transistor 113, which is turned on sooner in the selection circuit 103. With such a structure, data can be written to the latch circuit 101 quickly.

In Period 2, a high-level potential is input as a control signal S2 to a gate of the transistor 104 and a gate of the transistor 105, so that the transistor 104 and the transistor 105 are turned on. Consequently, the potential of the first terminal of the latch circuit 101 is input to a node N1, and the potential of the second terminal of the latch circuit 101 is input to a node N2.

In Period 3, a low-level potential is input as the control signal S2 to the gate of the transistor 104 and the gate of the transistor 105, so that the transistor 104 and the transistor 105 are turned off. Next, a low-level potential is input as the potential V1 to the third terminal of the latch circuit 101. Accordingly, supply of power supply voltage to the memory element is stopped. The low-level potential is input as the control signal S2 to the gate of the transistor 110 and the gate of the transistor 111, so that the transistor 110 and the transistor 111 are turned off. The inverted signal of the control signal S2 is input to the gate of the transistor 112 and the gate of the transistor 113, so that the transistor 112 and the transistor 113 are turned off.

Since the potential V1 and the control signal S1 are each changed to the low-level potential, the potentials of the first terminal and the second terminal of the latch circuit 101 cannot be held. However, with the use of a transistor in which a channel is formed in an oxide semiconductor film as each of the transistor 104 and the transistor 105, a potential (potential of the node N1) held by the capacitor 106 and a potential (potential of the node N2) held by the capacitor 107 can be held for a long time even after the transistor 104 and the transistor 105 are turned off. That is, after supply of the power supply voltage is stopped, the potential (DataA) held in the first terminal of the latch circuit 101 can be held in the node N1, and the potential (DataAB) held in the second terminal of the latch circuit 101 can be held in the node N2.

Next, a high-level potential is input as the potential V1 to the third terminal of the latch circuit 101 to start supply of the power supply voltage.

In Period 4, the high-level potential is input as the control signal S2 to the gate of the transistor 104 and the gate of the transistor 105, so that the transistor 104 and the transistor 105 are turned on.

Next, the high-level potential is input as the control signal S1 to the gate of the transistor 110 and the gate of the transistor 111, so that the transistor 110 and the transistor 111 are turned on. Further, since the control signal S1 is inverted by the inverter 114, the inverted signal of the control signal S1 is input to the gate of the transistor 112 and the gate of the transistor 113. Accordingly, the transistor 112 and the transistor 113 are turned on.

Since the transistor 110 and the transistor 112 are turned on, the high-level potential is input to the gate of the transistor 109, so that the transistor 109 is turned off. Further, since the transistor 111 and the transistor 113 are turned on, the low-level potential is input to the gate of the transistor 108, so that the transistor 108 is turned on.

At this time, the potential of the first terminal of the latch circuit 101 is determined by the transistor 110 or the transistor 112, one of which is turned on sooner than the other, in the selection circuit 102. Similarly, the potential of the second terminal of the latch circuit 101 is determined by the transistor 111 or the transistor 113, one of which is turned on sooner than the other, in the selection circuit 103. Therefore, data can be quickly read and transmitted to the latch circuit 101 as compared to the case of the memory element in FIG. 1.

As described above, in the memory element according to one embodiment of the present invention, a transistor in which a channel is formed in an oxide semiconductor is used as each of the transistor 104 and the transistor 105. Such a transistor has a characteristic of extremely small off-state current. Therefore, even while the power supply voltage is not supplied to the memory element (even while the transistor 104 and the transistor 105 are off), the potentials held in the node N1 and the node N2 can be held for a long time. In this manner, the memory element can hold data (DataA and DataAB) even while supply of the power supply voltage is stopped. Further, power consumption of the memory element can be reduced.

<Application Example of Memory Element>

Next, an application example of the memory element in FIG. 1 or FIG. 3 will be described with reference to FIG. 4. A memory device 200 can be manufactured by integrating the memory element 100 in FIG. 1 or the memory element 150 in FIG. 3.

Figure 4:
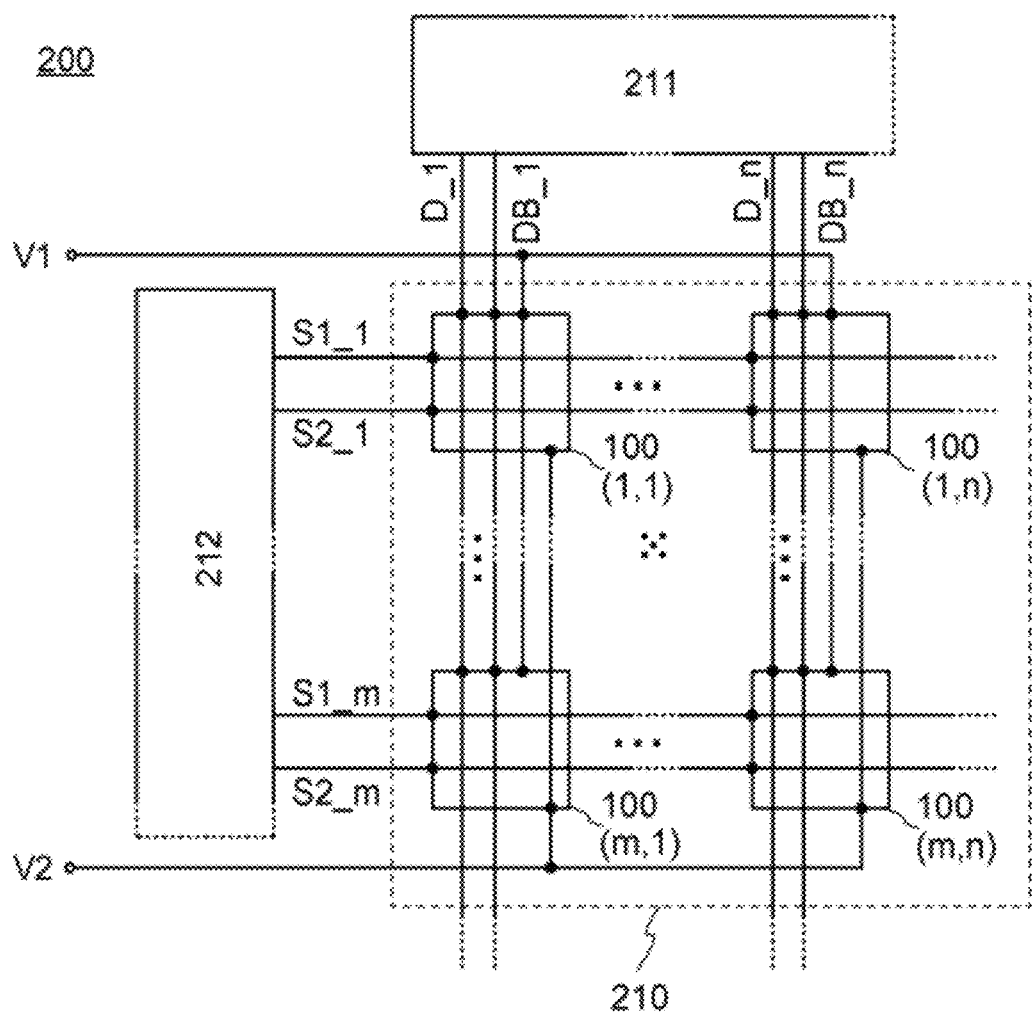
FIG. 4 is a block diagram of a memory device.

FIG. 4 is an example of a block diagram of a memory device including (m×n) memory elements 100. As a structure of the memory element 100 in FIG. 4, the structure illustrated in FIG. 1 is employed; however, as a structure of the memory element 100 in FIG. 4, the structure illustrated in FIG. 3 can also be employed.

The memory device 200 in FIG. 4 includes m (m is an integer of 2 or more) signal lines S1, m signal lines S2, n (n is an integer of 2 or more) data lines D, n data lines DB, a power supply line V1, a power supply line V2, a memory cell array 210 having the memory elements 100 arranged in a matrix of m rows (in the vertical direction)×n columns (in the horizontal direction), a first driver circuit 211, and a second driver circuit 212. The first driver circuit 211 is connected to the n data lines D and the n data lines DB, and the second driver circuit 212 is connected to the m signal lines S1 and the m signal lines S2.

Access to the memory elements 100 (1, 1) to 100 (m, n) is performed through the signal lines S1 and the signal lines S2. Data is written and read to/from the memory cells connected to the respective data lines D and data lines DB.

The first driver circuit 211 controls access through the data lines D and the data lines DB to the memory cells in the horizontal direction. On the other hand, the second driver circuit 212 controls access through the signal lines S1 and the signal lines S2 to the memory cells in the vertical direction.

With the above operation, random access to the memory cell array 210 in FIG. 4 is possible.

With the use of a memory element according to one embodiment of the present invention for a memory device such as a register or a cache memory included in an MPU, power consumption can be reduced. Further, data in the memory device can be prevented from being lost due to stop of supply of power supply voltage. Furthermore, after the supply of the power supply voltage is restarted, the memory element can return in a short time to the same state as that before the power supply voltage is stopped. Therefore, the power supply can be stopped even for a short time in the MPU or one or a plurality of logic circuits included in the MPU. Accordingly, power consumption can be suppressed.

Therefore, one embodiment of the present invention can provide a memory element having a novel structure where data can be held even after power supply is stopped. Further, the area of the memory element can be reduced, so that higher integration of a memory device can be achieved.

Embodiment 2

In this embodiment, an example of a manufacturing method of the memory element described in Embodiment 1 will be described with reference to FIGS. 5A to 5E, FIGS. 6A to 6D, FIGS. 7A to 7C, and FIGS. 8A and 8B. First, a manufacturing method of the transistor 108 in the lower portion of the memory element will be described, and then, a manufacturing method of the transistor 104 and the capacitor 106 in the upper portion of the memory element will be described. Note that the transistors 109, 110, 111, 112, and 113 can be manufactured in the same manner as the transistor 108, and the transistor 105 and the capacitor 107 can be manufactured in the same manner as the transistor 104 and the capacitor 106, respectively.

<Manufacturing Method of Transistor in Lower Portion>

Figure 5A:
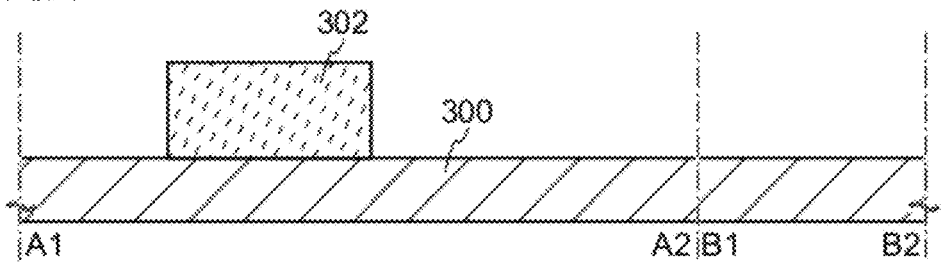
FIGS. 5A to 5E illustrate a manufacturing process of a memory device.
Figure 5B:
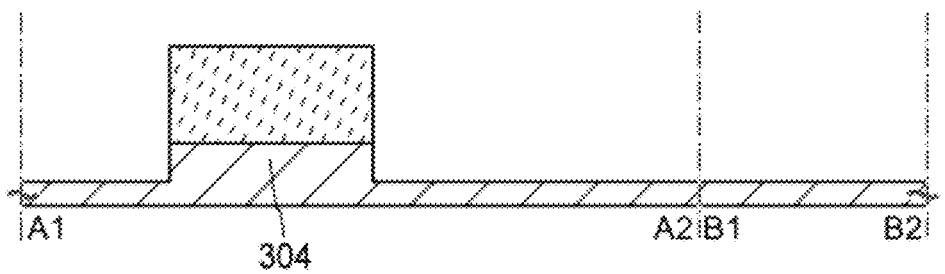

First, a substrate 300 is prepared (see FIG. 5A). For the substrate 300, a semiconductor material other than an oxide semiconductor can be used. As the substrate 300, a single crystal semiconductor substrate or a polycrystalline semiconductor substrate containing silicon, silicon carbide, or the like, or a compound semiconductor substrate containing silicon germanium, gallium arsenide, indium phosphide, or the like can be used. Alternatively, as the substrate 300, an SOT substrate can be used. Note that although the term "SOT substrate" generally means a substrate in which a silicon layer is provided on an insulating surface, the term "SOT substrate" in this specification and the like also includes a substrate in which a semiconductor film including a material other than silicon is provided on an insulating surface. That is, the semiconductor film included in the "SOT substrate" is not limited to a silicon layer. Moreover, the SOT substrate also includes a substrate having a structure in which a semiconductor film is provided over an insulating substrate such as a glass substrate with an insulating film interposed therebetween. Since the substrate 300 does not include an oxide semiconductor material, the substrate 300 is also referred to as substrate 300 including a semiconductor material other than an oxide semiconductor. Here, a single crystal silicon substrate is used as the substrate 300.

It is particularly preferable to use a single crystal semiconductor substrate including silicon or the like as the substrate 300, in order that the latch circuit 101, the selection circuit 102, the selection circuit 103, and the like described in Embodiment 1 can operate at higher speed.

Next, a protective layer 302 serving as a mask for forming an element isolation insulating film is formed over the substrate 300 (see FIG. 5A). As the protective layer 302, an insulating film formed using a material such as silicon oxide, silicon nitride, or silicon oxynitride can be used, for example. Note that before or after this step, an impurity element imparting n-type conductivity or p-type conductivity may be added to the substrate 300 in order to control the threshold voltage of the transistor. When silicon is used for the substrate 300, phosphorus, arsenic, or the like can be used as the impurity element imparting n-type conductivity, and boron, aluminum, gallium, or the like can be used as the impurity element imparting p-type conductivity.

Then, part of the substrate 300 in a region that is not covered with the protective layer 302 (in an exposed region) is removed by etching using the protective layer 302 as a mask. Thus, a semiconductor region 304 isolated from the other semiconductor regions is formed (see FIG. 5B). As the etching, dry etching is preferably performed, but wet etching may be performed. An etching gas and an etchant can be selected as appropriate depending on a material to be etched.

Figure 5C:
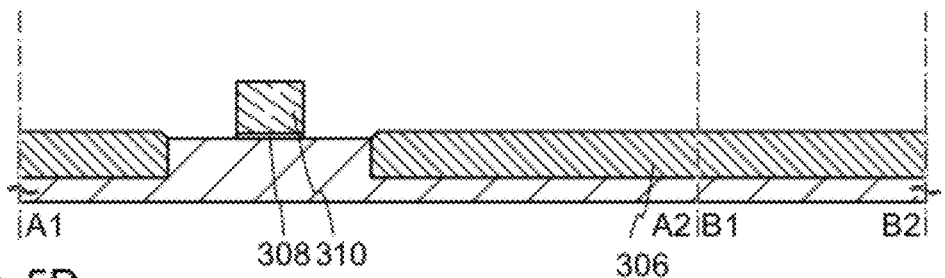

Then, an insulating film is formed so as to cover the semiconductor region 304, and the insulating film in a region overlapping with the semiconductor region 304 is selectively removed, whereby an element isolation insulating film 306 is formed (see FIG. 5C). As the insulating film, an insulating film formed using silicon oxide, silicon nitride, silicon oxynitride, or the like can be used. As a method for removing the insulating film, polishing treatment such as chemical mechanical polishing (CMP) (hereinafter, also referred to as CMP treatment), etching treatment, or the like can be given, and any of the above treatment may be used. Note that the protective layer 302 is removed after the formation of the semiconductor region 304 or after the formation of the element isolation insulating film 306.

Here, CMP treatment is a method of planarizing a surface of an object to be processed with a combination of chemical and mechanical actions, using the surface as a reference. Specifically, CMP treatment is a method in which a polishing cloth is attached to a polishing stage, the polishing stage and an object to be processed are rotated or swung while a slurry (an abrasive) is supplied between the object and the polishing cloth, and the surface of the object is polished by a chemical reaction between the slurry and the object and by action of mechanical polishing of the object with the polishing cloth.

Note that the element isolation insulating film 306 may be formed by, for example, introducing oxygen or nitrogen for formation of an insulating region, as well as by selectively removing the insulating film.

Next, an insulating film is formed on a surface of the semiconductor region 304, and a layer including a conductive material is formed over the insulating film.

The insulating film is to be a gate insulating film later and can be formed by performing heat treatment (e.g., thermal oxidation treatment or thermal nitridation treatment) on the surface of the semiconductor region 304, for example. Instead of heat treatment, high-density plasma treatment may be employed. High-density plasma treatment is performed using, for example, a mixed gas of any of a rare gas such as He, Ar, Kr, or Xe, oxygen, nitrogen oxide, ammonia, nitrogen, and hydrogen. Needless to say, the insulating film may be formed by a CVD method, a sputtering method, or the like. The insulating film preferably has a single-layer structure or a stacked structure including silicon oxide, silicon oxynitride, silicon nitride, hafnium oxide, aluminum oxide, tantalum oxide, yttrium oxide, hafnium silicate (Hf-$Si_xO_y$ (x>0, y>0)), hafnium silicate to which nitrogen is added (HfSi$_x$O$_y$N$_z$ (x>0, y>0, z>0)), hafnium aluminate to which nitrogen is added (HfAl$_x$O$_y$N$_z$ (x>0, y>0, z>0)), or the like. The thickness of the insulating film is, for example, greater than or equal to 1 nm and less than or equal to 100 nm, preferably greater than or equal to 10 nm and less than or equal to 50 nm.

The layer including a conductive material is to be a gate electrode later and can be formed using a metal material such as aluminum, copper, titanium, tantalum, or tungsten. Alternatively, the layer including a conductive material may be formed using a semiconductor material such as polycrystalline silicon. There is no particular limitation on the method for forming the layer including a conductive material, and a variety of film formation methods such as an evaporation method, a CVD method, a sputtering method, and a spin coating method can be employed. Note that in this embodiment, an example in which the layer including a conductive material is formed using a metal material is described.

Next, the insulating film and the layer including a conductive material are selectively etched to form a gate insulating film 308 and a gate electrode 310 (see FIG. 5C).

Figure 5D:
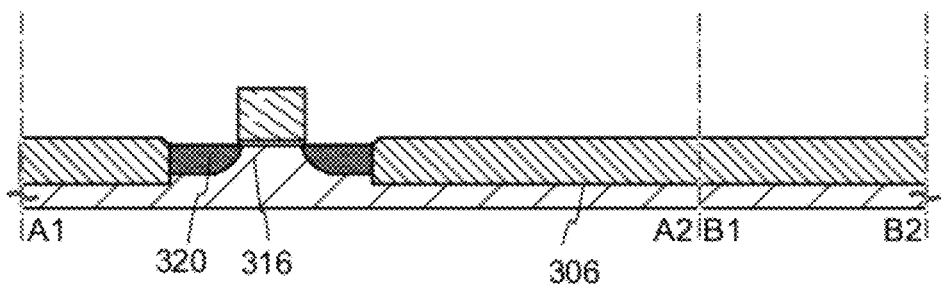

Next, an impurity element is added to the semiconductor region 304, whereby a channel formation region 316 and an impurity region 320 are formed (see FIG. 5D). In the case where an n-channel transistor is formed, phosphorus or arsenic may be added to the semiconductor region 304; in the case where a p-channel transistor is formed, an impurity element such as boron or aluminum may be added to the semiconductor region 304. Here, the concentration of the impurity element to be added can be set as appropriate; the concentration is preferably set high when a semiconductor element is highly miniaturized.

Note that a sidewall insulating film may be formed around the gate electrode 310 to form an impurity region to which an impurity element is added at a different concentration.

Figure 5E:
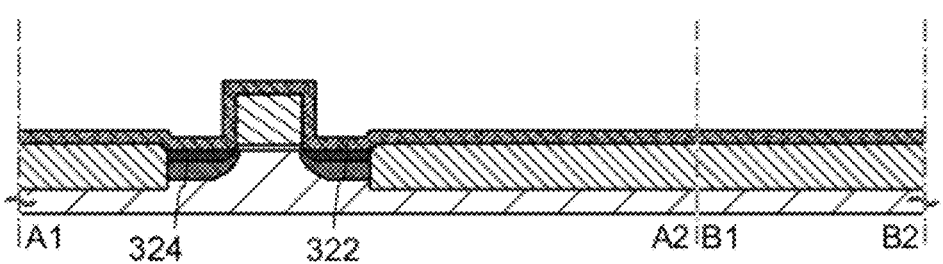

Then, a metal layer 322 is formed so as to cover the gate electrode 310, the impurity region 320, and the like (see FIG. 5E). Any of a variety of film formation methods such as a vacuum evaporation method, a sputtering method, and a spin coating method can be employed for forming the metal layer 322. It is preferable that the metal layer 322 be formed using a metal material that reacts with a semiconductor material included in the semiconductor region 304 to form a low-resistance metal compound. Examples of such a metal material include titanium, tantalum, tungsten, nickel, cobalt, and platinum.

Then, heat treatment is performed so that the metal layer 322 may react with the semiconductor material. Thus, a metal compound region 324 which is in contact with the impurity region 320 is formed (see FIG. 5E). Note that when the gate electrode 310 is formed using polycrystalline silicon or the like, a metal compound region is also formed in a region of the gate electrode 310 which is in contact with the metal layer 322.

As the heat treatment, irradiation with a flash lamp can be employed. Although it should be appreciated that another heat treatment method may be used, a method by which the heat treatment can be achieved in an extremely short time is preferably used in order to improve the controllability of chemical reaction for formation of the metal compound. Note that the metal compound region is formed by the reaction of the metal material and the semiconductor material and has sufficiently high conductivity. The formation of the metal compound region can sufficiently reduce electric resistance and improve element characteristics. Note that the metal layer 322 is removed after the metal compound region 324 is formed.

Figure 6A:
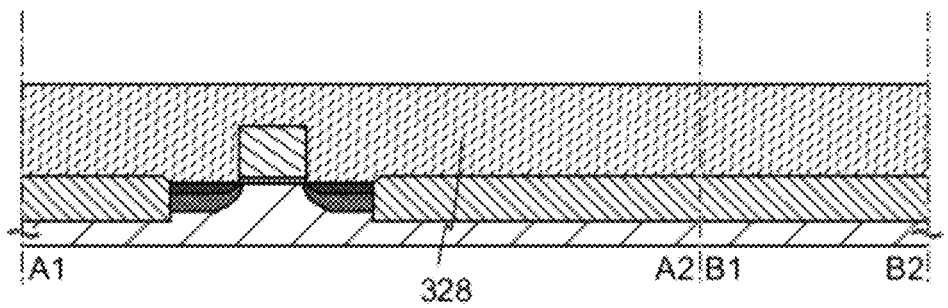
FIGS. 6A to 6D illustrate a manufacturing process of a memory device.
Figure 6B:
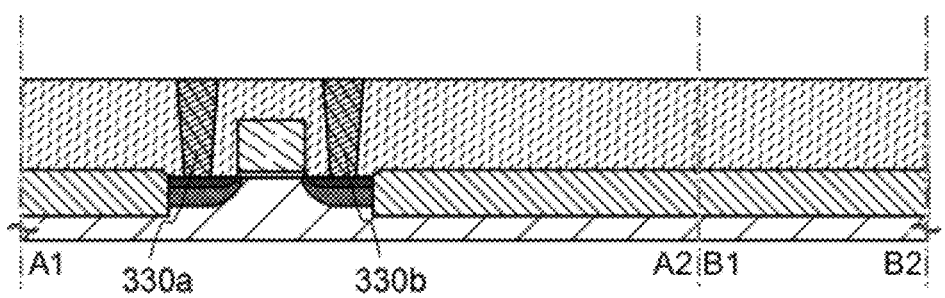

Next, an insulating film 328 is formed so as to cover the components formed in the above steps (see FIG. 6A). The insulating film 328 can be formed using a material containing an inorganic insulating material such as silicon oxide, silicon oxynitride, silicon nitride, or aluminum oxide. In particular, a material with a low dielectric constant (a low-k material) is preferably used for the insulating film 328 because capacitance due to overlap of electrodes or wirings can be sufficiently reduced. Note that the insulating film 328 may be a porous insulating film formed using any of those materials. A porous insulating film has a lower dielectric constant than an insulating film with high density, and thus allows a further reduction in capacitance generated by electrodes or wirings. Further, the insulating film 328 can be formed using an organic insulating material such as polyimide or acrylic. Although the insulating film 328 has a single-layer structure in FIG. 6A, the insulating film 328 may have a stacked structure of two or more layers.

Next, openings reaching the metal compound region 324 are formed in the insulating film 328, and a layer including a conductive material is formed so as to fill the openings. The layer including a conductive material can be formed using a metal material such as aluminum, copper, titanium, tantalum, or tungsten. Further, the layer including a conductive material may be formed using a semiconductor material such as polycrystalline silicon. There is no particular limitation on the method for forming the layer including a conductive material, and a variety of film formation methods such as an evaporation method, a CVD method, a sputtering method, and a spin coating method can be employed. The layer including a conductive material is selectively etched to form source and drain electrodes 330a and 330b (see FIG. 6B).

Next, a layer including a conductive material is formed over the insulating film 328. The layer including a conductive material can be formed using a material similar to the conductive material used for the source and drain electrodes 330a and 330b. The layer including a conductive material is subjected to etching treatment to form conductive layers 336a, 336b, and 336c (see FIG. 6C).

Figure 6C:
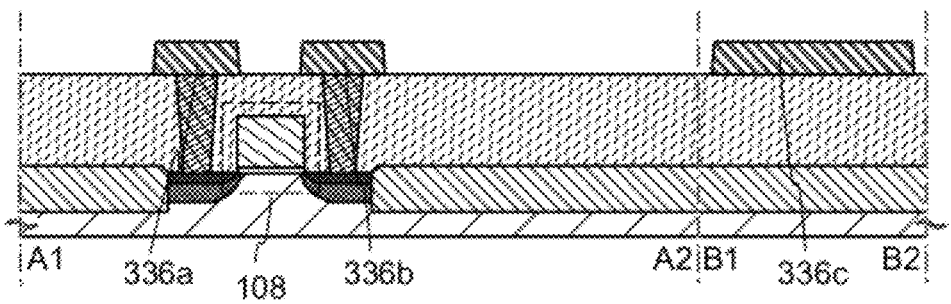

Through the above steps, the transistor 108 which uses the substrate 300 including a semiconductor material other than an oxide semiconductor can be manufactured (see FIG. 6C). The transistor 108 can operate at high speed. Therefore, application of the transistor 108 to the latch circuit 101, the selection circuit 102, the selection circuit 103, and the like is preferable in order that the latch circuit 101, the selection circuit 102, the selection circuit 103, and the like can operate at high speed.

Figure 6D:
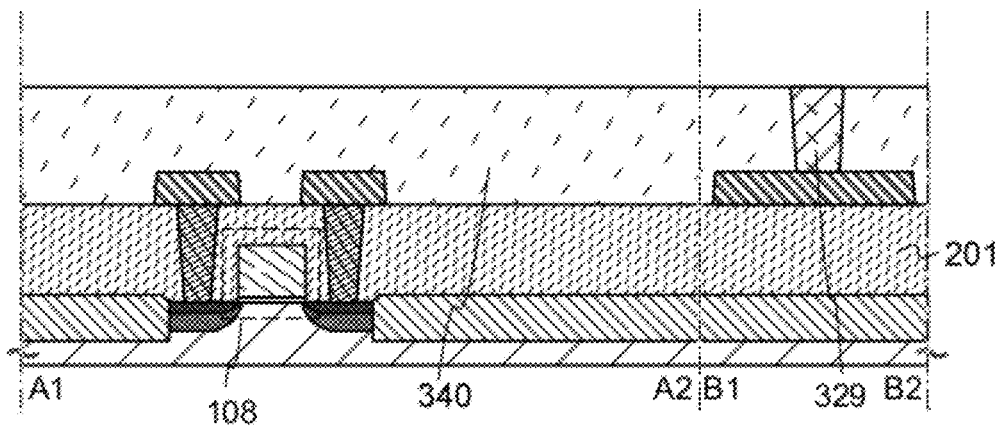

Next, the insulating film 340 is formed so as to cover the components formed in the above steps (see FIG. 6D). The insulating film 340 can be formed using the material and the formation method of the insulating film 328.

Next, an opening reaching the conductive layer 336c is formed in the insulating film 340, and a layer including a conductive material is formed so as to fill the opening. The layer including a conductive material can be formed using any of the materials and the formation methods described above for forming the gate electrode 310 and the conductive layers 336a, 336b, and 336c. The layer including a conductive material is subjected to etching treatment to form an electrode 329 (see FIG. 6D).

After that, as treatment before formation of the transistor 104 and the capacitor 106, CMP treatment is performed on the insulating film 340 to planarize a surface of the insulating film 340. At this time, a top surface of the electrode 329 is preferably exposed (see FIG. 6D). As planarization treatment of the insulating film 340, etching treatment or the like can also be employed instead of CMP treatment. In order to improve characteristics of the transistor 104, the surface of the insulating film 340 is preferably made as flat as possible. The average surface roughness ($R_a$) of the surface of the insulating film 340 is made greater than or equal to 0.1 nm and less than 0.5 nm so that an oxide semiconductor film in which the proportion of a crystalline portion is higher than that of an amorphous portion can be formed on the insulating film 340. Here, the average surface roughness ($R_a$) is obtained by three-dimension expansion of center line average surface roughness $R_a$ which is defined by JIS B 0601: 2001 (ISO 4287:1997) so that $R_a$ can be applied to a measurement surface, and is an average value of the absolute values of deviations from a reference surface to a specific surface. The average surface roughness ($R_a$) can be expressed by Formula 1 below.

$$Ra = \frac{1}{S_0} \int_{y_1}^{y_2} \int_{x_1}^{x_2} |f(x, y) - Z_0| \, dx \, dy \qquad \text{[Formula 1]}$$

In the above formula, $S_0$ represents the area of a plane to be measured (a rectangular region which is defined by four points represented by coordinates $(x_1, y_1)$, $(x_1, y_2)$, $(x_2, y_1)$, and $(x_2, y_2)$), and $Z_0$ represents the average height of the plane to be measured. Further, $R_a$ can be measured using an atomic force microscope (AFM).

Note that before or after each of the above steps, a step of forming an electrode, a wiring, a semiconductor film, an insulating film, or the like may be further performed. For example, a multilayer wiring structure in which an insulating film and a conductive layer are stacked may be employed as a wiring structure, so that a highly-integrated memory device can be achieved.

<Manufacturing Method of Transistor in Upper Portion>

First, an oxide semiconductor film is formed over the insulating film 340, the electrode 329, and the like.

An oxide semiconductor to be used preferably contains at least indium (In) or zinc (Zn). In particular, In and Zn are preferably contained. As a stabilizer for reducing changes in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn—based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an In—Ga—Zn-based oxide means an oxide containing In, Ga, and Zn as its main component, and there is no limitation on the ratio of In:Ga:Zn. Further, the In—Ga—Zn-based oxide may contain a metal element other than In, Ga, and Zn.

Alternatively, a material represented by $InMO_3(ZnO)_m$ (m>0, m is not an integer) may be used as the oxide semiconductor. Note that M represents one or more metal elements selected from Ga, Fe, Mn, and Co. Alternatively, as the oxide semiconductor, a material represented by $In_3SnO_5(ZnO)_n$ (n>0, n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having an appropriate composition may be used depending on needed semiconductor characteristics (such as mobility, threshold voltage, and variation). In order to obtain needed semiconductor characteristics, it is preferable that the carrier concentration, the impurity concentration, the defect density, the atomic ratio of a metal element to oxygen, the interatomic distance, the density, and the like be set to appropriate values.

For example, it is relatively easy to obtain high mobility with an In—Sn—Zn-based oxide. However, it is possible to obtain high mobility even with an In—Ga—Zn-based oxide by reducing the defect density in a bulk.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystalline. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor with an amorphous structure, interface scattering can be reduced, and relatively high mobility can be obtained with relative ease.

In an oxide semiconductor having crystallinity, defects in a bulk can be further reduced and when a surface flatness is improved, mobility higher than that of an oxide semiconductor in an amorphous state can be obtained. In order to improve the surface flatness, the oxide semiconductor is preferably formed on a flat surface.

When an In—Ga—Zn—O-based material is used as the oxide semiconductor film, for example, an oxide target having a composition ratio of $In_2O_3:Ga_2O_3:ZnO=1:1:1$ [molar ratio] can be used. Without limitation to the material and the component of this target, for example, an oxide target having a composition ratio of $In_2O_3:Ga_2O_3:ZnO=1:1:2$ [molar ratio] may be used.

For an In—Sn—Zn-based oxide, an oxide target which has a composition ratio of In:Sn:Zn=1:2:2, 2:1:3, 1:1:1, 20:45:35, or the like in atomic ratio is used.

In the case where an In—Zn—O-based material is used as the oxide semiconductor film, the composition ratio of a target is In:Zn=50:1 to 1:2 in atomic ratio ($In_2O_3:ZnO=25:1$ to 1:4 in molar ratio), preferably, In:Zn=20:1 to 1:1 in atomic ratio ($In_2O_3:ZnO=10:1$ to 1:2 in molar ratio), further preferably, In:Zn=15:1 to 1.5:1 in atomic ratio ($In_2O_3:ZnO=15:2$ to 3:4 in molar ratio). For example, in a target used for formation of an In—Zn—O-based oxide semiconductor which has an atomic ratio of In:Zn:O=X:Y:Z, the relation of Z>1.5X+Y is satisfied.

The relative density of the target is higher than or equal to 90% and lower than or equal to 100%, preferably higher than or equal to 95% and lower than or equal to 99.9%. With the use of the target with high filling rate, a dense oxide semiconductor film can be formed.

The oxide semiconductor film can be formed by a sputtering method, a molecular beam epitaxy method, an atomic layer deposition method, or a pulsed laser deposition method. The thickness of the oxide semiconductor film is greater than or equal to 5 nm and less than or equal to 100 nm, preferably greater than or equal to 10 nm and less than or equal to 30 nm.

In this embodiment, the oxide including a crystal with c-axis alignment (also referred to as c-axis aligned crystal (CAAC)), which has a triangular or hexagonal atomic arrangement when seen from the direction of an a-b plane, a surface, or an interface, will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

When a channel formation region of the transistor 104 (and the transistor 105) includes CAAC, a variation in electric characteristics of the transistor 104 (and the transistor 105) due to irradiation with visible light or ultraviolet light and application of heat or bias can be suppressed so that the reliability of the transistor can be improved.

As a formation method of an oxide semiconductor film including CAAC, the following two kinds of methods can be given, for example. One of them is that formation of an oxide semiconductor film is performed while a substrate is heated. The other is that formation of an oxide semiconductor film is performed in two steps, and heat treatment is performed after each formation step of the oxide semiconductor film.

In the case where an oxide semiconductor film is formed in one step while a substrate is heated, the substrate temperature may be higher than or equal to 150° C. and lower than or equal to 450° C., preferably higher than or equal to 250° C. and lower than or equal to 350° C. When the substrate is heated at high temperature during formation of the oxide semiconductor film, CAAC in which the proportion of a crystalline portion is higher than that of an amorphous portion can be formed.

In the case where formation of an oxide semiconductor film is performed in two steps, a first oxide semiconductor film is formed over the insulating film 340 while the substrate temperature is kept at a temperature higher than or equal to 100° C. and lower than or equal to 450° C., and then heat treatment is performed at a temperature higher than or equal to 550° C. and lower than the strain point of the substrate under an atmosphere of nitrogen, oxygen, a rare gas, or dry air. By the heat treatment, a crystalline region (including plate-like crystal) is formed in a region including a top surface of the first oxide semiconductor film. Next, a second oxide semiconductor film is formed thicker than the first oxide semiconductor film. After that, heat treatment is performed again at a temperature higher than or equal to 550° C. and lower than the strain point of the substrate, so that crystals grow upward using, as a seed of crystal growth, the first oxide semiconductor film in which a crystalline region (including plate-like crystal) is formed in the region including the top surface. Thus, the second oxide semiconductor film is entirely crystallized. Note that the thickness of the first oxide semiconductor film is preferably greater than or equal to 1 nm and less than or equal to 10 nm.

The above formation method is preferable because a short-channel effect can be suppressed even when the thickness of the oxide semiconductor film 344 is approximately 5 nm.

The oxide semiconductor film formed by a sputtering method contains hydrogen or water (including a compound having a hydroxyl group) in some cases. Moisture and hydrogen easily form a donor level and thus serve as impurities in the oxide semiconductor. Therefore, in the formation of the oxide semiconductor film by a sputtering method, the hydrogen concentration in the oxide semiconductor film is preferably reduced as much as possible.

In order to reduce the hydrogen concentration, the leakage rate of a treatment chamber of a sputtering apparatus is set to $1 \times 10^{-10}$ Pa·m$^3$/s or less in the formation of the oxide semiconductor film, whereby entry of impurities such as an alkali metal and hydride into the oxide semiconductor film that is being deposited by a sputtering method can be reduced. Further, with the use of an entrapment vacuum pump (e.g., a cryopump) as an evacuation system, counter flow of impurities such as alkali metal, a hydrogen atom, a hydrogen molecule, water, a hydroxyl group, and hydride from the evacuation system can be reduced.

Oxygen, a high-purity rare gas (typically, argon) from which impurities such as hydrogen, water, a compound having a hydroxyl group, and hydride is removed, or a mixed gas of the rare gas and oxygen is used as appropriate as an atmosphere gas supplied to a treatment chamber of a sputtering apparatus. For example, the purity of argon is set to 9N (99.9999999%) or higher (the concentration of $H_2O$ is 0.1 ppb, and the concentration of $H_2$ is 0.5 ppb), and the dew point thereof is set to −121° C. The oxygen concentration is set to 8N (99.999999%) or higher (the concentration of $H_2O$ is 1 ppb, and the concentration of $H_2$ is 1 ppb), and the dew point thereof is set to −112° C. In the case where a mixed gas of the rare gas and oxygen is used, the flow rate ratio of oxygen is preferably high.

As one example of the film formation condition, the distance between the substrate and the target is 100 mm, the pressure is 0.6 Pa, the direct-current (DC) power source is 0.5 kW, and the atmosphere is an oxygen atmosphere (the proportion of the oxygen flow rate ratio is 100%). Note that a pulsed direct-current (DC) power source is preferable because dust generated in film formation can be reduced and the film thickness can be made uniform.

Since the crystallinity of CAAC is affected by roughness of a surface where CAAC is formed, the surface of the insulating film 340 is preferably made as flat as possible. By planarizing the surface of the insulating film 340, the continuity of CAAC can be improved. The average surface roughness of the insulating film 340 is preferably greater than or equal to 0.1 nm and less than 0.5 nm.

In this manner, the oxide semiconductor film in which the amount of contained hydrogen is small can be formed. Note that even when the sputtering apparatus is used, the oxide semiconductor film contains more than a little nitrogen. For example, the nitrogen concentration in the oxide semiconductor film measured by secondary ion mass spectrometry (SIMS) is lower than $5 \times 10^{18}$ cm$^{-3}$.

During or after formation of the oxide semiconductor film, electric charge is generated owing to oxygen deficiency in the oxide semiconductor film in some cases. In general, when oxygen deficiency is caused in an oxide semiconductor film, part of the oxygen deficiency becomes a donor to generate an electron as a carrier. When an electron as a carrier is generated, the threshold voltage of the transistor 104 is shifted negatively.

In order to reduce impurities such as moisture and hydrogen in the oxide semiconductor film (dehydration or dehydrogenation), the oxide semiconductor film is preferably subjected to first heat treatment. For example, the oxide semiconductor film is subjected to heat treatment in a reduced-pressure atmosphere, an inert gas atmosphere of nitrogen, a rare gas, or the like, an oxygen gas atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) method).

For example, the first heat treatment is performed at a temperature higher than or equal to 150° C. and lower than the strain point of the substrate, preferably higher than or equal to 250° C. and lower than or equal to 450° C., further preferably higher than or equal to 300° C. and lower than or equal to 450° C., in an oxidizing atmosphere or an inert atmosphere. Here, the oxidizing atmosphere refers to an atmosphere including an oxidation gas such as oxygen, ozone, or nitrogen oxide at 10 ppm or higher. The inert atmosphere refers to an atmosphere which includes the oxidation gas at lower than 10 ppm and is filled with nitrogen or a rare gas. The treatment time is 3 minutes to 24 hours. It is preferable that the heat treatment time be 24 hours or shorter in order not to reduce the productivity.

There is no particular limitation on a heat treatment apparatus used for the first heat treatment, and the apparatus may be provided with a device for heating an object to be processed by heat radiation or heat conduction from a heating element such as a resistance heating element. For example, an electric furnace, or a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

By the first heat treatment, hydrogen (water, a compound having a hydroxyl group) can be released from the oxide semiconductor film. Further, by the first heat treatment, impurities are reduced so that an i-type (intrinsic) or substantially i-type oxide semiconductor film can be formed.

Furthermore, hydrogen that is an unstable carrier source can be eliminated from the oxide semiconductor film by the first heat treatment, whereby the threshold voltage of the transistor 104 can be prevented from being shifted negatively. As a result, the reliability of the transistor 104 can be improved.

Figure 7A:
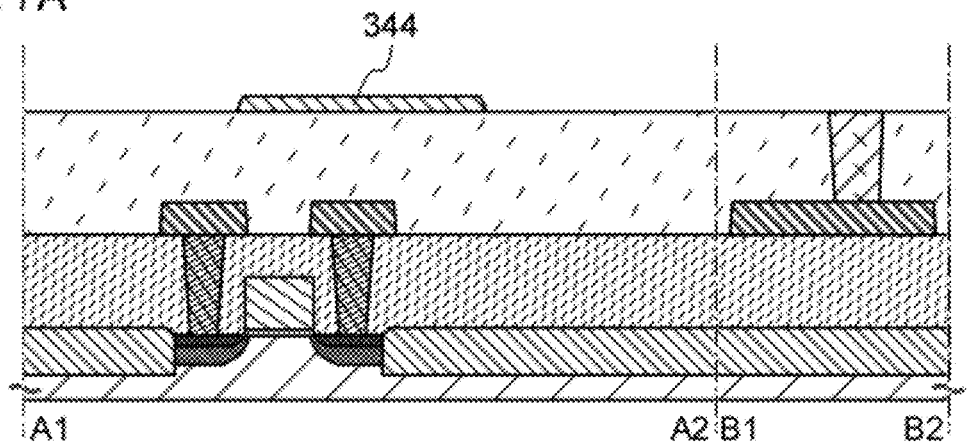
FIGS. 7A to 7C illustrate a manufacturing process of a memory device.

Next, a resist mask is formed through a photolithography step over the oxide semiconductor film, and the oxide semiconductor film is etched to have a desired shape with the use of the resist mask; in this manner, the island-shaped oxide semiconductor film 344 is formed (see FIG. 7A). The resist mask can be formed by an ink-jet method, a printing method, or the like as appropriate, as well as through the photolithography step. The etching is preferably performed so that an end portion of the oxide semiconductor film has a tapered shape. The end portion of the island-shaped oxide semiconductor film is tapered, whereby in the manufacturing process of the transistor 104, coverage with a film which is formed after this etching step can be improved, and disconnection of the film can accordingly be prevented. The tapered shape can be formed by performing etching while the resist mask is made to recede.

Next, a layer including a conductive material is formed over the oxide semiconductor film 344 and the like.

The layer including a conductive material is to be a source electrode and a drain electrode later, and can be formed using a metal material such as aluminum, chromium, copper, titanium, tantalum, molybdenum, or tungsten. Alternatively, the layer including a conductive material can be formed using an alloy containing any of the above metal materials as a component, or the like. Moreover, one or more materials selected from manganese, magnesium, zirconium, beryllium, neodymium, and scandium may be used.

The layer including a conductive material may have a single-layer structure or a stacked structure of two or more layers. For example, the layer including a conductive material can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked. Note that when the layer including a conductive material has a single-layer structure of a titanium film or a titanium nitride film, there is an advantage that it can be easily processed into source and drain electrodes 342a and 342b having tapered shapes.

Further, as the layer including a conductive material, indium oxide, indium tin oxide (also referred to as ITO), indium zinc oxide, zinc oxide, zinc oxide to which gallium is added, graphene, or the like can be used.

Figure 7B:
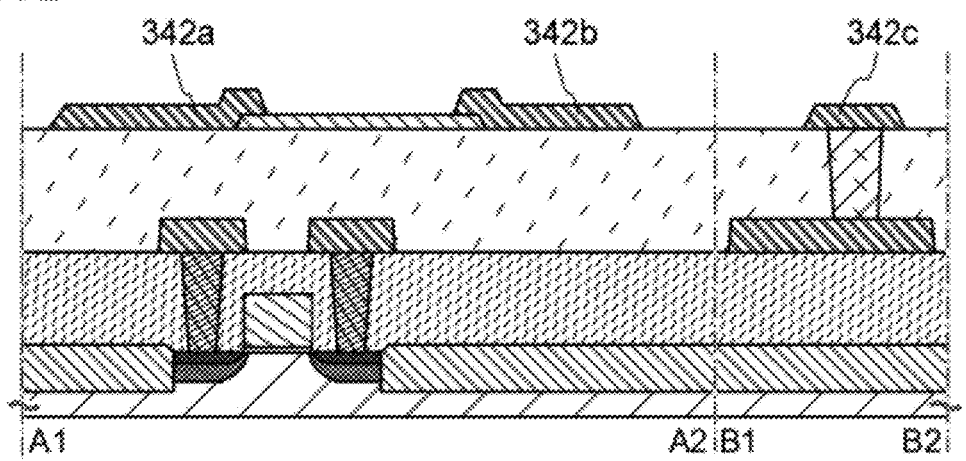

The layer including a conductive material is selectively etched to form the source and drain electrodes 342a and 342b and an electrode 342c (see FIG. 7B). Here, the source or drain electrode 342a functions as an electrode of the capacitor. The conductive layer 336c and the electrode 342c are connected to each other through the electrode 329, whereby the transistor formed in the upper portion of the semiconductor device and the transistor formed in the lower portion of the semiconductor device can be connected to each other.

The layer including a conductive material is preferably etched such that the source and drain electrodes 342a and 342b and the electrode 342c are formed to have tapered end portions. Here, the taper angle thereof is, for example, preferably greater than or equal to 30° and less than or equal to 60°. When the source and drain electrodes 342a and 342b are formed by etching so as to have tapered end portions, coverage with the gate insulating film which is formed later can be improved and disconnection of the gate insulating film can be prevented.

The channel length (L) of the transistor is determined by the distance between a lower end portion of the source or drain electrode 342a and a lower end portion of the source or drain electrode 342b. Note that in light exposure for forming a mask for a transistor with a channel length (L) less than 25 nm, it is preferable to use extreme ultraviolet rays whose wavelength is as short as several nanometers to several tens of nanometers. The resolution of light exposure with extreme ultraviolet rays is high and the depth of focus is large. Accordingly, the channel length (L) of the transistor formed later can be greater than or equal to 10 nm and less than or equal to 1000 nm (1 μm), whereby the operation speed of the circuit can be increased. Moreover, power consumption of the memory element can be reduced by miniaturization.

Figure 7C:
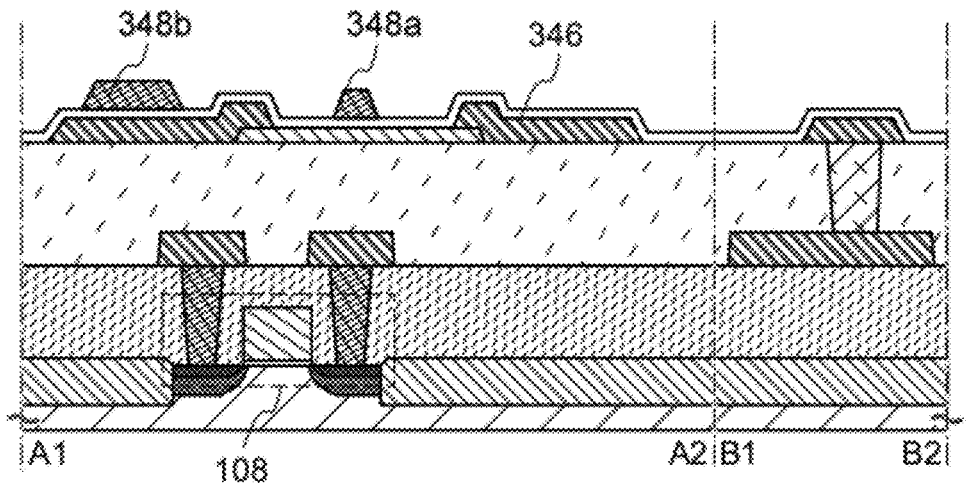

Next, a gate insulating film 346 is formed so as to cover the source and drain electrodes 342a and 342b and the electrode 342c and to be in contact with part of the oxide semiconductor film 344 (see FIG. 7C).

The gate insulating film 346 can be formed by a CVD method, a sputtering method, or the like. The gate insulating film 346 can be formed using silicon oxide, silicon nitride, silicon oxynitride, gallium oxide, aluminum oxide, tantalum oxide, or the like. Alternatively, the gate insulating film 346 may be formed using a material with a high dielectric constant (a high-k material) such as hafnium oxide, yttrium oxide, hafnium silicate ($HfSi_xO_y$ (x>0, y>0)), hafnium silicate to which nitrogen is added ($HfSi_xO_yN$, (x>0, y>0, z>0)), or hafnium aluminate to which nitrogen is added ($HfAl_xO_yN_z$ (x>0, y>0, z>0)). The gate insulating film 346 has either a single-layer structure or a stacked structure in which these materials are combined. There is no particular limitation on the thickness of the gate insulating film 346; in the case where the memory element is miniaturized, the gate insulating film 346 is preferably thin in order to ensure the operation of the transistor. For example, in the case of using silicon oxide, the thickness can be greater than or equal to 1 nm and less than or equal to 100 nm, preferably greater than or equal to 10 nm and less than or equal to 50 nm.

When the gate insulating film is thin as in the above description, a problem of gate leakage due to a tunneling effect or the like is caused. In order to solve the problem of gate leakage, the above high-k material is preferably used for the gate insulating film 346. With the use of a high-k material for the gate insulating film 346, the thickness of the gate insulating film 346 can be increased to prevent gate leakage and at the same time electrical characteristics can be maintained. Note that a stacked structure of a film including a high-k material and a film containing any of silicon oxide, silicon nitride, silicon oxynitride, silicon nitride oxide, aluminum oxide, and the like may be employed.

Further, the gate insulating film 346 may be formed using an insulating material containing a Group 13 element and oxygen. Many of oxide semiconductor materials contain a Group 13 element, and an insulating material containing a Group 13 element works well with oxide semiconductor materials. Therefore, with the use of an insulating material containing a Group 13 element and oxygen for an insulating film in contact with the oxide semiconductor film, an interface with the oxide semiconductor film can keep a favorable state.

Here, an insulating material containing a Group 13 element refers to an insulating material containing one or more Group 13 elements. As the insulating material containing a Group 13 element, gallium oxide, aluminum oxide, aluminum gallium oxide, gallium aluminum oxide, or the like can be given as an example. Here, the amount of aluminum is larger than that of gallium in atomic percent in aluminum gallium oxide, whereas the amount of gallium is larger than or equal to that of aluminum in atomic percent in gallium aluminum oxide.

For example, when a material containing gallium oxide is used for the gate insulating film 346 that is in contact with the oxide semiconductor film containing gallium, characteristics at the interface between the oxide semiconductor film and the gate insulating film can be kept favorable. The oxide semiconductor film and an insulating film containing gallium oxide are provided in contact with each other, so that pileup of hydrogen at the interface between the oxide semiconductor film and the insulating film can be reduced. Note that a similar effect can be obtained in the case where an element in the same group as a constituent element of the oxide semiconductor is used in an insulating film. For example, it is effective to form an insulating film with the use of a material containing aluminum oxide. Note that aluminum oxide has a property of not easily transmitting water. Thus, it is preferable to use a material containing aluminum oxide in terms of preventing entry of water into the oxide semiconductor film.

By the first heat treatment performed on the oxide semiconductor film 344, oxygen in the oxide semiconductor film 344 is released together with hydrogen. When oxygen is released from the oxide semiconductor film 344, oxygen deficiency is caused therein. Part of the oxygen deficiency becomes a donor, which leads to generation of carriers in the oxide semiconductor film 344. As a result, characteristics of the transistor might be affected.

Therefore, an insulating film from which oxygen is discharged by heat treatment is preferably used as the gate insulating film 346 in contact with the oxide semiconductor film 344.

In this specification and the like, the expression "oxygen is discharged by heat treatment" means that the amount of discharged oxygen (or released oxygen) which is converted into oxygen atoms is greater than or equal to $1.0 \times 10^{18}$ cm$^{-3}$, preferably greater than or equal to $3.0 \times 10^{20}$ cm$^{-3}$, in thermal desorption spectroscopy (TDS) analysis. In contrast, the expression "oxygen is not discharged by heat treatment" means that the amount of discharged oxygen (or released oxygen) which is converted into oxygen atoms is less than $1.0 \times 10^{18}$ cm$^{-3}$.

A method for quantifying the amount of released oxygen which is converted into oxygen atoms, with the use of TDS analysis is described below.

The amount of discharged gas in TDS analysis is proportional to the integral value of ion intensity. Therefore, the amount of discharged gas can be calculated from the ratio between the integral value of ion intensity of an insulating film and the reference value of a standard sample. The standard sample refers to a sample containing a predetermined density of atoms, and the reference value of the standard sample refers to the ratio of the predetermined density of atoms to the integral value of ion intensity corresponding to the atoms.

For example, the number of the discharged oxygen molecules ($N_{O2}$) from an insulating film can be found according to the following formula with the TDS analysis results of a silicon wafer containing hydrogen at a predetermined density which is the standard sample and the TDS analysis results of the insulating film. Here, all gases having a mass number of 32 which are obtained in the TDS analysis are assumed to originate from an oxygen molecule. Note that $CH_3OH$, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal $$N_{O2} = \frac{N_{H2}}{S_{H2}} \times S_{O2} \times \alpha \quad \text{[Formula 2]}$$

In the formula, $N_{H2}$ is the value obtained by conversion of the number of hydrogen molecules desorbed from the standard sample into densities, and $S_{H2}$ is the integral value of ion intensity when the standard sample is subjected to TDS analysis. Here, the reference value of the standard sample is set to $N_{H2}/S_{H2}$. Further, $S_{O2}$ is the integral value of ion intensity when the insulating film is subjected to TDS analysis, and a is a coefficient affecting the ion intensity in the TDS analysis. Japanese Published Patent Application No. H6-275697 can be referred to for details of the above formula. Note that the above value of the amount of discharged oxygen is obtained by measurement with a thermal desorption spectrometer produced by ESCO Ltd., EMD-WA1000S/W using a silicon wafer containing hydrogen atoms at $1\times10^{16}$ cm$^{-3}$ as the standard sample.

Further, in the TDS analysis, part of released oxygen is detected as an oxygen atom. The ratio between oxygen molecules and oxygen atoms can be calculated from the ionization rate of the oxygen molecules. Note that, since the above α includes the ionization rate of the oxygen molecules, the number of the discharged oxygen atoms can also be estimated through the evaluation of the number of the discharged oxygen molecules.

Note that $N_{O2}$ is the number of the discharged oxygen molecules. In the insulating film, the amount of discharged oxygen when converted into oxygen atoms is twice the number of the discharged oxygen molecules.

As an example of a film from which oxygen is discharged by heat treatment, a film of oxygen-excess silicon oxide ($SiO_X$ (X>2)) is given. In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

An insulating film from which oxygen is discharged by heat treatment is used as an insulating film in contact with the oxide semiconductor film 344 (for example, the insulating film 340, the gate insulating film 346), and is subjected to second heat treatment in any of steps after the formation of the gate insulating film 346, so that oxygen is discharged from the insulating film 340 and the gate insulating film 346 to be supplied to the oxide semiconductor film 344. Consequently, oxygen deficiency generated in the oxide semiconductor film 344 can be compensated for. Therefore, generation of carriers in the oxide semiconductor film 344 can be suppressed, whereby a variation in electric characteristics of the transistor can be suppressed.

Next, a layer including a conductive material is formed so as to cover the components formed in the above steps. The layer including a conductive material can be formed using a metal material such as molybdenum, titanium, tantalum, tungsten, aluminum, copper, neodymium, or scandium, or an alloy material containing any of these materials as its main component. The layer including a conductive material is selectively etched to form a gate electrode 348a and a conductive layer 348b. The conductive layer 348b functions as an electrode of the capacitor. Note that the gate electrode 348a and the conductive layer 348b have either a single-layer structure or a stacked structure.

After the gate electrode 348a and the conductive layer 348b are formed, dopant imparting n-type conductivity is added to the oxide semiconductor film 344 with the use of the gate electrode 348a and the source and drain electrodes 342a and 342b as masks; in this manner, a pair of dopant regions 349a and 349b is formed. In the oxide semiconductor film 344, a region between the dopant region 349a and the dopant region 349b serves a channel formation region. The channel formation region in the oxide semiconductor film 344 overlaps with the gate electrode 348a with the gate insulating film 346 interposed therebetween.

The addition of dopant for forming the dopant regions 349a and 349b can be performed by an ion implantation method. As the dopant, for example, a rare gas such as helium, argon, or xenon, a Group 15 element such as nitrogen, phosphorus, arsenic, or antimony, or the like can be used. For example, in the case where nitrogen is used as the dopant, the concentration of nitrogen atoms in the dopant regions 349a and 349b is preferably higher than or equal to $5\times10^{19}$/cm$^3$ and lower than or equal to $1\times10^{22}$/cm$^3$. The dopant regions 349a and 349b to which the dopant imparting n-type conductivity is added have higher conductivity than the other regions in the oxide semiconductor film 344. Therefore, by providing the dopant regions 349a and 349b in the oxide semiconductor film 344, the resistance between the source and drain electrodes 342a and 342b can be decreased.

Figure 8A:
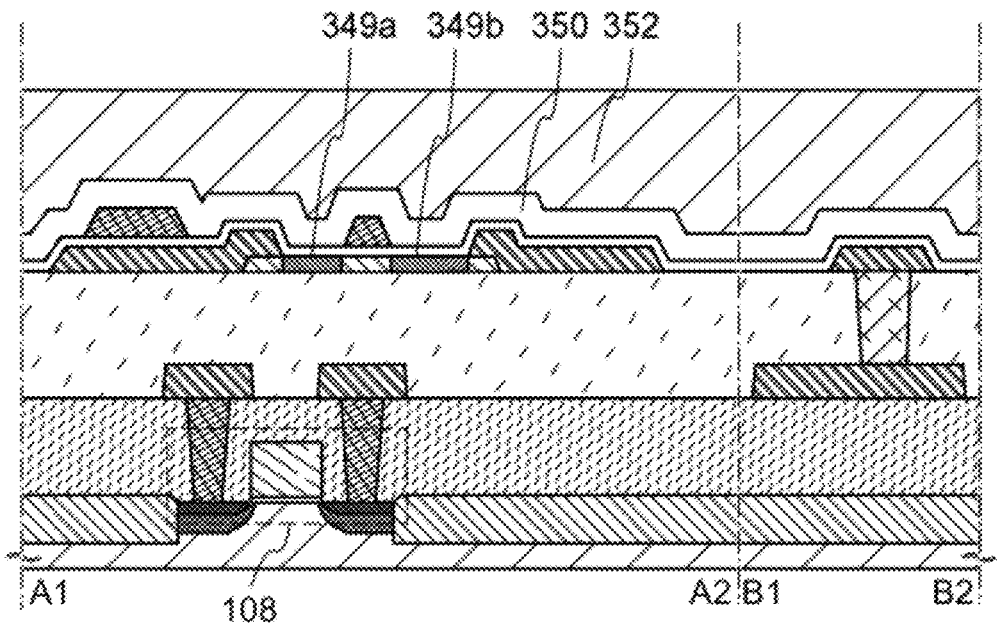
FIGS. 8A and 8B illustrate a manufacturing process of a memory device.

Then, an insulating film 350 and an insulating film 352 are formed over the gate insulating film 346, the gate electrode 348a, and the conductive layer 348b (see FIG. 8A). The insulating film 350 and the insulating film 352 can be formed by a PVD method, a CVD method, or the like. The insulating film 350 and the insulating film 352 can be formed using a material containing an inorganic insulating material such as silicon oxide, silicon oxynitride, silicon nitride, hafnium oxide, gallium oxide, or aluminum oxide, or a material containing an organic material such as polyimide or acrylic. Note that for the insulating film 350 and the insulating film 352, a material with a low dielectric constant or a structure with a low dielectric constant (e.g., a porous structure) is preferably used. When the dielectric constant of the insulating film 350 and the insulating film 352 is lowered, the capacitance generated between wirings or electrodes can be reduced, which results in higher speed operation. For example, a material containing an inorganic material can be used for the insulating film 350 and a material containing an organic material can be used for the insulating film 352.

An aluminum oxide film has a property of blocking hydrogen, water, and the like. Therefore, the insulating film 350 is preferably formed using an aluminum oxide film in order to prevent hydrogen, water, and the like from entering the oxide semiconductor film 344 from the outside of the semiconductor device. Further, an aluminum oxide film also has a property of blocking oxygen, so that outward diffusion of oxygen contained in the oxide semiconductor film 344 can be suppressed. The use of an aluminum oxide film for the insulating film 350 not only can prevent hydrogen, water, and the like from entering the oxide semiconductor film 344 but also can suppress outward diffusion of oxygen contained in the oxide semiconductor film 344. Therefore, a variation in electric characteristics of the transistor can be suppressed.

Next, openings reaching the source or drain electrode 342b and the electrode 342c are formed in the gate insulating film 346, the insulating film 350, and the insulating film 352. The openings are formed by selective etching with the use of a mask or the like. After that, a layer including a conductive material is formed in contact with the source or drain electrode 342b and the electrode 342c. Next, the layer including a conductive material is subjected to etching or CMP treatment to form an electrode 354a and an electrode 354b (see FIG. 8A).

Figure 8B:
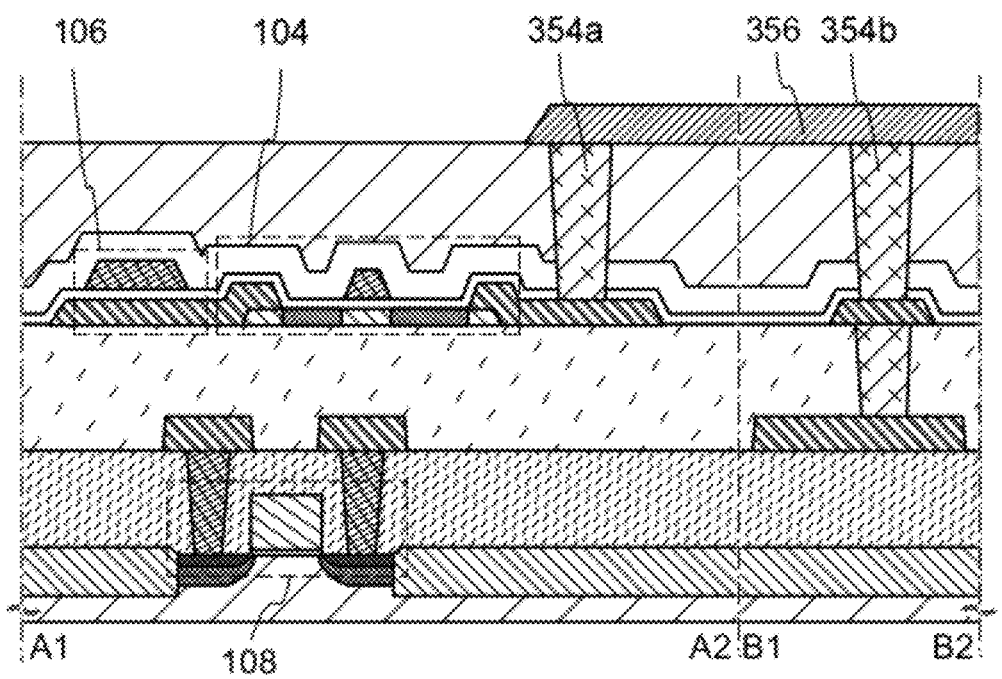

Next, a wiring 356 is formed so as to cover the insulating film 352 and be in contact with the electrode 354a and the electrode 354b (see FIG. 8B). The wiring 356 is formed in such a manner that a layer including a conductive material is formed by a PVD method or a CVD method and then the layer including a conductive material is patterned. As a material of the layer including a conductive material, an element selected from aluminum, chromium, copper, tantalum, titanium, molybdenum, or tungsten, an alloy containing any of these elements as a component, or the like can be used. Any of manganese, magnesium, zirconium, beryllium, neodymium, and scandium, or a material including any of these in combination may be used.

Further, the wiring 356 may be formed without formation of the electrode 354a and the electrode 354b. For example, it is possible to employ a method in which a thin titanium film is formed in a region including the openings of the insulating film 350 by a PVD method and then an aluminum film is formed so as to be embedded in the openings. Here, the titanium film formed by a PVD method has a function of reducing an oxide film (e.g., a natural oxide film) formed on a surface where the titanium film is formed, to decrease contact resistance with a lower electrode or the like (here, the source or drain electrode 342b and the electrode 342c). In addition, hillock of the aluminum film can be prevented. A copper film may be formed by a plating method after the formation of the barrier film of titanium, titanium nitride, or the like.

By the wiring 356, the transistor formed in the lower portion and the source or drain electrode 342b of the transistor 104 can be connected to each other (see FIG. 8B).

Thus, the memory element in which the transistor 104 including the highly purified oxide semiconductor film 344 and the capacitor 106 are formed is completed (see FIG. 8B).

Through the above steps, the memory element in which the transistor including an oxide semiconductor material is formed over the transistor including a semiconductor material other than an oxide semiconductor can be manufactured.

By the above manufacturing method, the oxide semiconductor film 344 in which the amount of impurities such as hydrogen and an alkali metal is extremely small can be obtained. The hydrogen concentration in the oxide semiconductor film 344 can be $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower, for example. Further, impurities such as Li and Na which are alkali metals and Ca which is an alkaline earth metal in the oxide semiconductor film 344 are preferably reduced: specifically, the Li concentration, the Na concentration, and the K concentration measured by SIMS are each preferably $5 \times 10^{15}$ cm$^{-3}$ or lower, more preferably $1 \times 10^{15}$ cm$^{-3}$ or lower.

When the transistor 104 is manufactured using the oxide semiconductor film 344, a transistor whose off-state current is extremely small can be manufactured. Specifically, the off-state current density can be 100 zA/µm or lower, preferably 10 zA/µm or lower. This value of off-state current density is lower than the off-state current density of a transistor in which a channel is formed in a crystalline silicon film. The use of the transistor 104 for a memory element enables stored data to be held for a long time because the off-state current of the transistor 104 can be extremely small as described above.

In the memory element according to one embodiment of the present invention, the transistors 104 and 105 in which a channel is formed in an oxide semiconductor film and the capacitors 106 and 107 can be formed over the latch circuit 101 and the selection circuits 102 and 103 each including a transistor in which a channel is formed in a film including a semiconductor other than an oxide semiconductor. In this manner, the transistors 104 and 105 in which a channel is formed in an oxide semiconductor film can be stacked over a transistor in which a channel is formed in a film including a semiconductor other than an oxide semiconductor; thus, the memory element can be formed three-dimensionally. Therefore, the area of a two-dimensional plane of the memory element can be drastically decreased.

A magnetic tunneling junction element (an MTJ element) is known as a nonvolatile random access memory. The MTJ element stores data in a low resistance state when the spin directions in films provided above and below an insulating film are parallel, and stores data in a high resistance state when the spin directions are not parallel. On the other hand, the first and second nonvolatile memory circuits included in the memory element according to one embodiment of the present invention utilizes a transistor whose channel is formed in an oxide semiconductor film. The principles of the MTJ element and the first and second nonvolatile memory circuits are completely different from each other. Table 1 shows comparison between the MTJ element (indicated by "spintronics (MTJ element)" in the table) and the first and second nonvolatile memory circuits including an oxide semiconductor described in the above embodiment (indicated by "OS/Si" in the table).

TABLE 1

|  | Spintronics (MTJ element) | OS/Si |
| --- | --- | --- |
| Heat resistance | Curie temperature | Process temperature at 500° C. (reliability at 150° C.) |
| Driving method | Current driving | Voltage driving |
| Writing principle | Changing spin direction of magnetic material | Turning on/off FET |
| Si LSI | Suitable for bipolar LSI (For highly integrated circuit, MOS LSI is preferable to bipolar LSI, which is unsuitable for high integration. Note that W becomes larger.) | Suitable for MOS LSI |
| Overhead | Large (because of high Joule heat) | Smaller than overhead of MTJ element by 2 to 3 or more orders of magnitude (because of utilizing charging and discharging of parasitic capacitance) |
| Nonvolatility | Utilizing spin | Utilizing low off-state current |
| Read cycles | No limitation | No limitation |
| 3D structure | Difficult (at most two layers) | Easy (with a limitless number of layers) |
| Integration degree (F$^2$) | 4 F$^2$ to 15 F$^2$ | Depending on the number of layers stacked in 3D structure (need heat resistance high enough to withstand process of forming upper OS FET) |

TABLE 1-continued

|  | Spintronics (MTJ element) | OS/Si |
| --- | --- | --- |
| Material | Magnetic rare-earth element | OS material |
| Cost per bit | High | Low (might be slightly high depending on constituent of OS (e.g., In)) |
| Resistance to magnetic field | Low | High |

The MTJ element is disadvantageous in that its magnetic properties are lost when the temperature is the Curie temperature or higher because it contains a magnetic material. Further, the MTJ element is driven by current and thus is compatible with a silicon bipolar device. However, a silicon bipolar device is unsuitable for high integration. Furthermore, the MTJ element has a problem in that its power consumption is increased with the increase in memory capacity, although the MTJ element requires low write current.

In principle, the MTJ element has low resistance to a magnetic field, so that the spin direction is likely to change when the MTJ element is exposed to a high magnetic field. Moreover, it is necessary to control magnetic fluctuation due to a nanoscale magnetic material used for the MTJ element.

In addition, a rare earth element is used for the MTJ element; thus, it requires special attention to incorporate a process of forming the MTJ element in a process of forming a silicon semiconductor that is sensitive to metal contamination. Further, the MTJ element is expensive in terms of the material cost per bit.

On the other hand, the transistor including an oxide semiconductor, which is included in the first and second nonvolatile memory circuits in the above embodiment, has an element structure and an operation principle similar to those of a silicon MOSFET except that a semiconductor material for forming a channel is a metal oxide. Further, the transistor including an oxide semiconductor is not affected by a magnetic field, and does not cause soft errors. These facts show that the transistor is highly compatible with a silicon integrated circuit.

This embodiment can be implemented in appropriate combination with any of the above embodiments.

Embodiment 3

In this embodiment, an oxide material suitable for a signal processing circuit such as a CPU or the like will be described with reference to FIGS. 12A to 12E, FIGS. 13A to 13C, FIGS. 14A to 14C, and FIG. 15.

A transistor used in a CPU or the like is required to operate even at a frequency in the high frequency band in some cases. The transistor preferably has high field-effect mobility. For example, the field-effect mobility of the transistor is preferably 1 cm$^2$/V·s to 30 cm$^2$/V·s or higher. By including an oxide film in which a channel is formed and which includes CAAC (c-axis aligned crystal), such a transistor having high field-effect mobility can be achieved.

An example of a crystal structure of the CAAC will be described in detail with reference to FIGS. 12A to 12E, FIGS. 13A to 13C, and FIGS. 14A to 14C. In FIGS. 12A to 12E, FIGS. 13A to 13C, and FIGS. 14A to 14C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 12A to 12E, O surrounded by a circle represents tetracoordinate O and O surrounded by a double circle represents tricoordinate O.

Figure 12A:
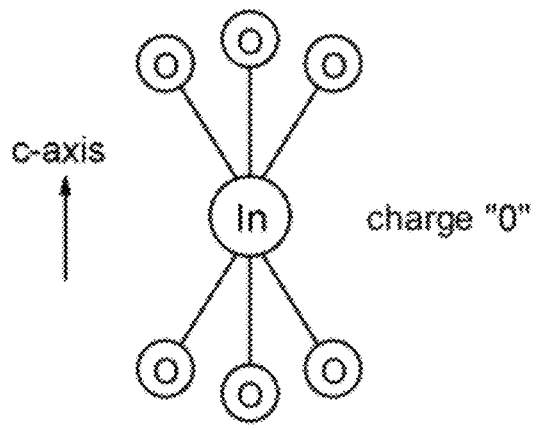
FIGS. 12A to 12E illustrate structures of oxide materials according to one embodiment of the present invention.

FIG. 12A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 12A is actually an octahedral structure, but is illustrated as a planar structure for simplicity. Note that three tetracoordinate O atoms exist in each of an upper half and a lower half in FIG. 12A. In the small group illustrated in FIG. 12A, electric charge is 0.

Figure 12D:
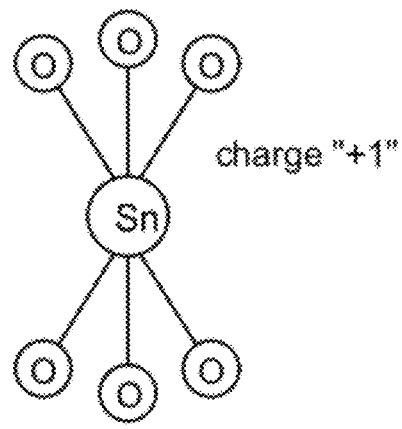
Figure 12B:
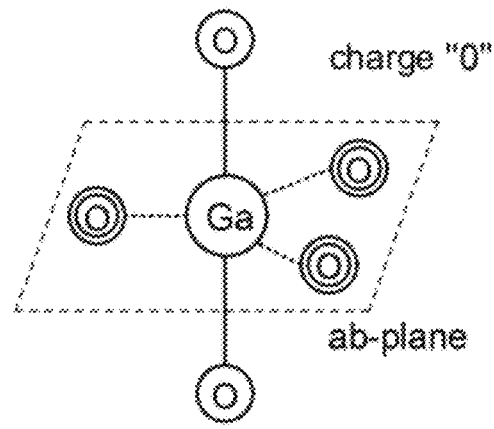

FIG. 12B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 12B. An In atom can also have the structure illustrated in FIG. 12B because an In atom can have five ligands. In the small group illustrated in FIG. 12B, electric charge is 0.

Figure 12E:
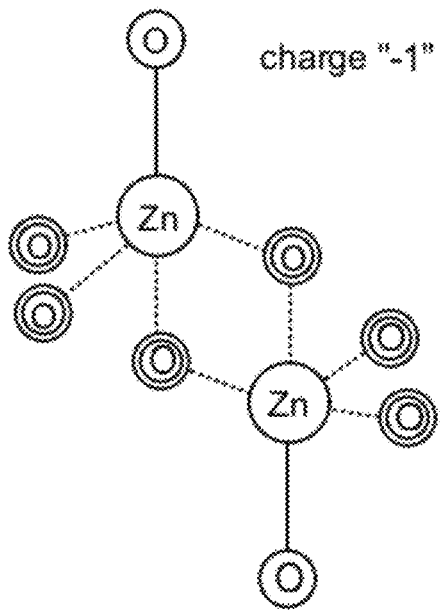
Figure 12C:
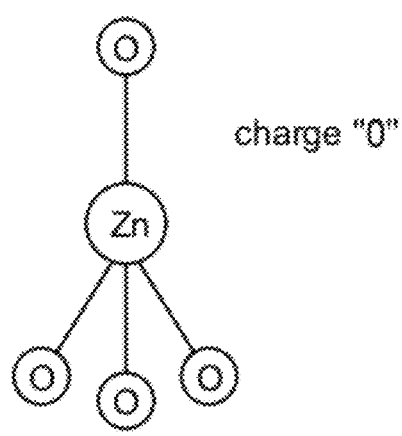

FIG. 12C illustrates a structure including one tetracoordinate Zn atom and four tetracoordinate O atoms proximate to the Zn atom. In FIG. 12C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 12C. In the small group illustrated in FIG. 12C, electric charge is 0.

FIG. 12D illustrates a structure including one hexacoordinate Sn atom and six tetracoordinate O atoms proximate to the Sn atom. In FIG. 12D, three tetracoordinate O atoms exist in each of an upper half and a lower half. In the small group illustrated in FIG. 12D, electric charge is +1.

FIG. 12E illustrates a small group including two Zn atoms. In FIG. 12E, one tetracoordinate O atom exists in each of an upper half and a lower half. In the small group illustrated in FIG. 12E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 12A each have three proximate In atoms in the downward direction, and the three O atoms in the lower half each have three proximate In atoms in the upward direction. The one O atom in the upper half with respect to the pentacoordinate Ga atom in FIG. 12B has one proximate Ga atom in the downward direction, and the one O atom in the lower half has one proximate Ga atom in the upward direction. The one O atom in the upper half with respect to the tetracoordinate Zn atom in FIG. 12C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 13A illustrates a model of a medium group included in a layered structure of an In—Sn—Zn—O-based material. FIG. 13B illustrates a large group including three medium groups. Note that FIG. 13C illustrates an atomic arrangement in the case where the layered structure in FIG. 13B is observed from the c-axis direction.

In FIG. 13A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 13A, one tetracoordinate O atom existing in each of an upper half and a lower half with respect to an In atom is denoted by circled 1. FIG. 13A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based oxide in FIG. 13A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively.

For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 12E can be given. For example, with one small group including two Zn atoms, electric charge of one small group including a Sn atom can be cancelled, so that the total electric charge of the layered structure can be 0.

When the large group illustrated in FIG. 13B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 14A:
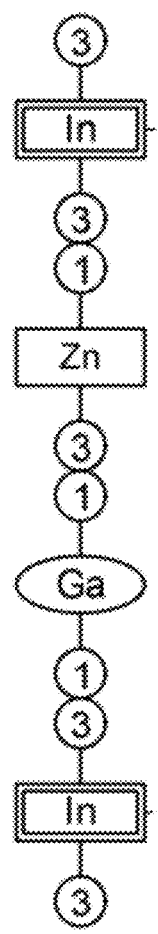
FIGS. 14A to 14C illustrate a structure of an oxide material according to one embodiment of the present invention.

As an example, FIG. 14A illustrates a model of a medium group included in a layered structure of an In—Ga—Zn—O-based material.

In the medium group included in the layered structure of the In—Ga—Zn—O-based material in FIG. 14A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 14B:
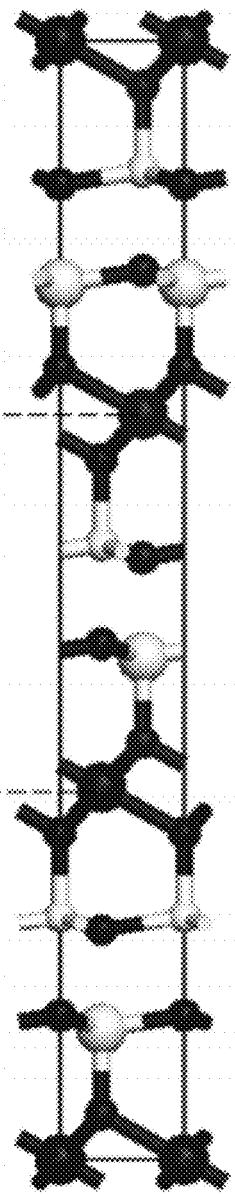
Figure 14C:
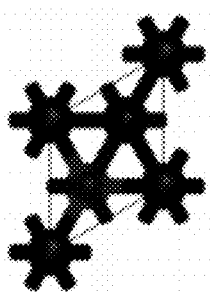

FIG. 14B illustrates a large group including three medium groups. Note that FIG. 14C illustrates an atomic arrangement in the case where the layered structure in FIG. 14B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 14A but also a medium group in which the arrangement of the In atom, the Ga atom, and the Zn atom is different from that in FIG. 14A.

A transistor used in a CPU or the like is required to operate even at a frequency in the high frequency band. In that case, the field-effect mobility of the transistor is preferably 30 cm$^2$/V·s or higher. Such a transistor having high field-effect mobility can be achieved with the use of an oxide semiconductor film including CAAC.

When such CAAC is used for an oxide film where a channel is formed, a transistor having a field-effect mobility of 30 cm$^2$/V·s or higher can be manufactured. Such a transistor is capable of operating even at a high frequency, and is thus suitable as a transistor used in a CPU or the like which operates at a frequency in the high frequency band.

Embodiment 4

In this embodiment, a structure of a signal processing circuit including the memory element 100 illustrated in FIG. 1 or the memory device 200 illustrated in FIG. 4 will be described.

Figure 9:
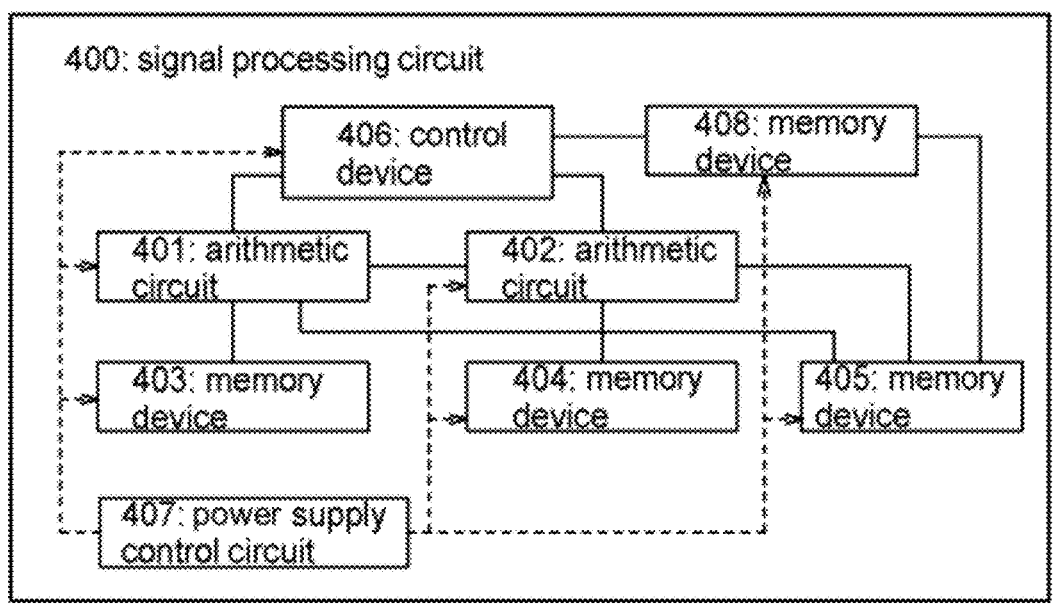
FIG. 9 is a block diagram of a signal processing circuit.

FIG. 9 illustrates an example of a signal processing circuit according to one embodiment of the present invention. The signal processing circuit at least includes one or a plurality of arithmetic circuits and one or a plurality of memory devices. Specifically, a signal processing circuit 400 illustrated in FIG. 9 includes an arithmetic circuit 401, an arithmetic circuit 402, a memory device 403, a memory device 404, a memory device 405, a control device 406, a power supply control circuit 407, and a memory device 408.

The arithmetic circuits 401 and 402 each include, as well as a logic circuit which carries out simple logic arithmetic processing, an adder, a multiplier, and various arithmetic circuits. The memory device 403 functions as a register for temporarily holding data when the arithmetic processing is carried out in the arithmetic circuit 401. The memory device 404 functions as a register for temporarily holding data when the arithmetic processing is carried out in the arithmetic circuit 402.

In addition, the memory device 405 can be used as a main memory and can store a program executed by the control device 406 as data or can store data from the arithmetic circuit 401 and the arithmetic circuit 402.

The control device 406 is a circuit which collectively controls operations of the arithmetic circuit 401, the arithmetic circuit 402, the memory device 403, the memory device 404, and the memory device 405 included in the signal processing circuit 400. Note that in FIG. 9, a structure in which the control device 406 is provided in the signal processing circuit 400 as a part thereof is illustrated, but the control device 406 may be provided outside the signal processing circuit 400.

In addition, as well as the supply of the power supply voltage to the memory device, the supply of the power supply voltage to the control circuit or the arithmetic circuit which transmits/receives data to/from the memory device may be stopped. For example, when the arithmetic circuit 401 and the memory device 403 are not operated, the supply of the power supply voltage to the arithmetic circuit 401 and the memory device 403 may be stopped.

In addition, the power supply control circuit 407 controls the level of the power supply voltage which is supplied to the arithmetic circuit 401, the arithmetic circuit 402, the memory device 403, the memory device 404, the memory device 405, the control device 406, and the memory device 408 included in the signal processing circuit 400. Further, in the case where the supply of the power supply voltage is stopped, a switching element for stopping the supply of the power supply voltage may be provided for the power supply control circuit 407, or for each of the arithmetic circuit 401, the arithmetic circuit 402, the memory device 403, the memory device 404, the memory device 405, the control device 406, and the memory device 408. In the latter case, the power supply control circuit 407 is not necessarily provided in the signal processing circuit according to the present invention.

The memory device 408 which functions as a cache memory is preferably provided between the memory device 405 that is a main memory and the control device 406. By providing the cache memory, low-speed access to the main memory can be reduced and the speed of the signal processing such as arithmetic processing can be higher. The use of the memory device 200 according to one embodiment of the present invention for the memory device 408 functioning as a cache memory leads to a reduction in power consumption of the signal processing circuit 400. Further, shortly after the supply of the power supply voltage is restarted, the memory element can be returned to the same state as that before the power supply is stopped. A reduction in area of the memory element according to one embodiment of the present invention is achieved. Accordingly, the use of the memory element for a memory device enables the memory device to be highly integrated.

This embodiment can be implemented in appropriate combination with any of the above embodiments.

Embodiment 5

With the use of a memory device according to one embodiment of the present invention, an electronic device with low power consumption can be provided. In particular, in the case of a portable electronic device which has difficulty in continuously receiving power, when a memory device with low power consumption according to one embodiment of the present invention is added as a component of the device, an advantage in increasing the continuous operation time can be obtained. Further, by the use of a transistor with small off-state current, redundant circuit design which is needed to cover a failure caused by large off-state current is unnecessary; therefore, the integration degree of the memory device can be increased, and a memory device having higher functionality can be formed.

A memory device according to one embodiment of the present invention can be used for display devices, personal computers, or image reproducing devices provided with recording media (typically, devices which reproduce the content of recording media such as digital versatile discs (DVDs) and have displays for displaying the reproduced images). In addition, as an electronic device which can employ a memory device according to one embodiment of the present invention, mobile phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given.

The case where a memory device according to one embodiment of the present invention is applied to electronic devices such as a mobile phone, a smartphone, and an e-book reader will be described.

Figure 10:
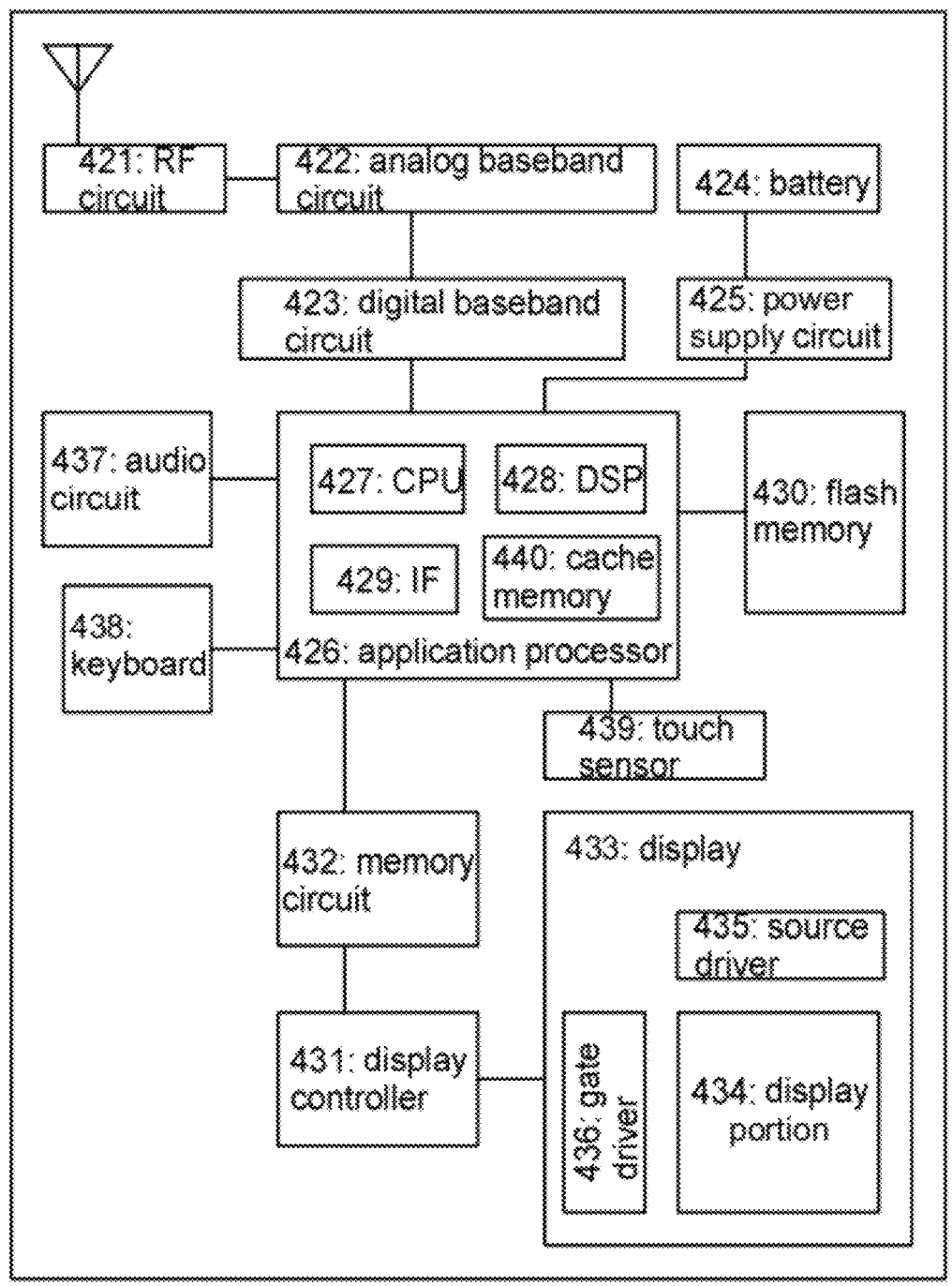
FIG. 10 is a block diagram of a portable electronic device.

FIG. 10 is a block diagram of a portable electronic device. The portable electronic device illustrated in FIG. 10 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, an interface 429, and a cache memory 440. The use of a memory device according to one embodiment of the present invention for the cache memory 440 leads to a reduction in power consumption of the application processor 426. Further, shortly after supply of power supply voltage is restarted, the memory device can be returned to the same state as that before the power supply is stopped. A reduction in area of a memory element according to one embodiment of the present invention is achieved. Accordingly, the use of the memory element for a memory device enables the memory device to be highly integrated. Note that the memory circuit 432 includes a DRAM.

Figure 11:
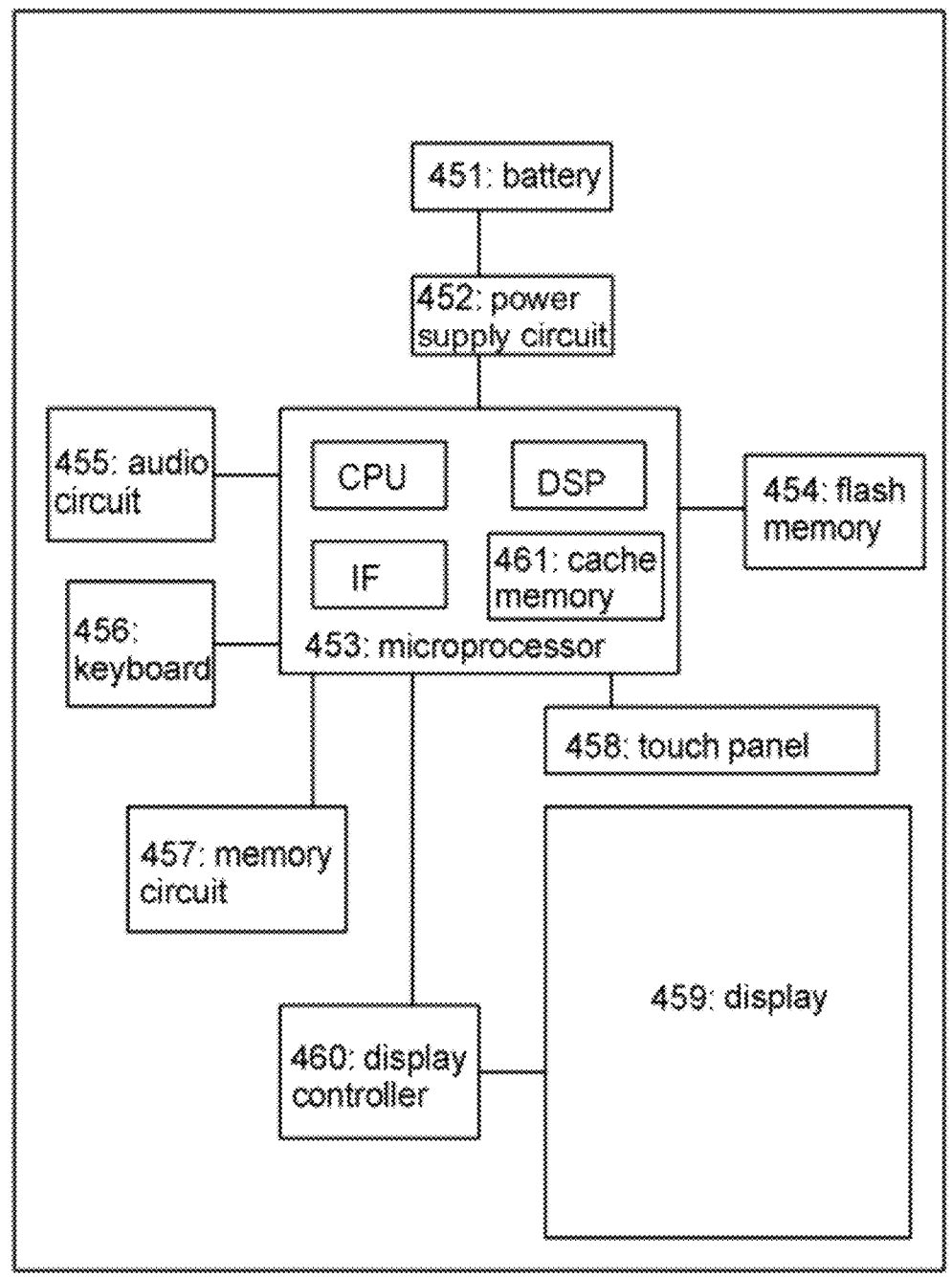
FIG. 11 is a block diagram of a memory circuit.

FIG. 11 is a block diagram of an e-book reader. The e-book reader includes a battery 451, a power supply circuit 452, a microprocessor 453, a flash memory 454, an audio circuit 455, a keyboard 456, a memory circuit 457, a touch panel 458, a display 459, and a display controller 460. The microprocessor 453 includes a cache memory 461. The use of a memory device according to one embodiment of the present invention for the cache memory 461 leads to a reduction in power consumption of the microprocessor 453. Further, shortly after supply of power supply voltage is restarted, the memory device can be returned to the same state as that before the power supply is stopped. A reduction in area of a memory element according to one embodiment of the present invention is achieved. Accordingly, the use of the memory element for a memory device enables the memory device to be highly integrated.

For example, in the case where a user uses a highlighting function of changing a display color, drawing an underline, using a bold font, changing the type of letter, or the like in a specific portion in e-book data so that the specific portion is in clear contrast to the other portions, data of the portion specified by the user in the e-book data needs to be stored. The memory circuit 457 has a function of storing such data temporarily. Note that in the case where such data is held for a long time, it may be copied to the flash memory 454.

This embodiment can be implemented in appropriate combination with any of the above embodiments.

Embodiment 6

The actually measured field-effect mobility of an insulated gate transistor can be lower than its original mobility because of a variety of reasons; this phenomenon occurs not only in the case of using a transistor whose channel is formed in an oxide semiconductor layer. One of the reasons that reduce the mobility is a defect inside a semiconductor or a defect at the interface between the semiconductor and an insulating film. When a Levinson model is used, the field-effect mobility that is based on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility $\mu$ can be expressed as the following formula.

$$\mu = \mu_0 \exp\left(-\frac{E}{kT}\right) \quad \text{[Formula 3]}$$

Here, E represents the height of the potential barrier, k represents the Boltzmann constant, and T represents the absolute temperature. When the potential barrier is assumed to be attributed to a defect, the height E of the potential barrier can be expressed as the following formula according to the Levinson model.

$$E = \frac{e^2 N^2}{8\epsilon n} = \frac{e^3 N^2 t}{8\epsilon C_{ox} V_g} \quad \text{[Formula 4]}$$

Here, e represents the elementary charge, N represents the average defect density per unit area in a channel, ε represents the permittivity of the semiconductor, n represents the number of carriers per unit area in the channel, $C_{ox}$ represents the capacitance per unit area, $V_g$ represents the gate voltage, and t represents the thickness of the channel. Note that in the case where the thickness of the semiconductor film is less than or equal to 30 nm, the thickness of the channel may be regarded as being the same as the thickness of the semiconductor film. The drain current $I_d$ in a linear region can be expressed as the following formula.

$$I_d = \frac{W \mu V_g V_d C_{ox}}{L} \exp\left(-\frac{E}{kT}\right) \quad \text{[Formula 5]}$$

Here, L represents the channel length and W represents the channel width, and L and W are each 10 μm. Further, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\epsilon C_{ox} V_g} \quad \text{[Formula 6]}$$

The right side of Formula 6 is a function of $V_g$. From the formula, it is found that the defect density N can be obtained from the slope of a line in a graph that is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, or the like, $\mu_0$ can be calculated to be 120 cm²/Vs from Formula 3 and Formula 4. The measured mobility of an In—Sn—Zn oxide including a defect is approximately 35 cm²/Vs. However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at the interface between a channel and a gate insulating film adversely affects the transport property of the transistor. In other words, the mobility $\mu_1$ at a position that is distance x away from the interface between the channel and the gate insulating film can be expressed as the following formula.

$$\frac{1}{\mu_1} = \frac{1}{\mu_0} + \frac{D}{B}\exp\left(-\frac{x}{G}\right) \qquad \text{[Formula 7]}$$

Here, D represents the electric field in the gate direction, and B and G are constants. Note that B and G can be obtained from actual measurement results; according to the above measurement results, B is $4.75\times10^7$ cm/s and G is 10 nm (the depth to which the influence of interface scattering reaches). When D is increased (i.e., when the gate voltage is increased), the second term of Formula 7 is increased and accordingly the mobility $\mu_1$ is decreased.

Figure 15:
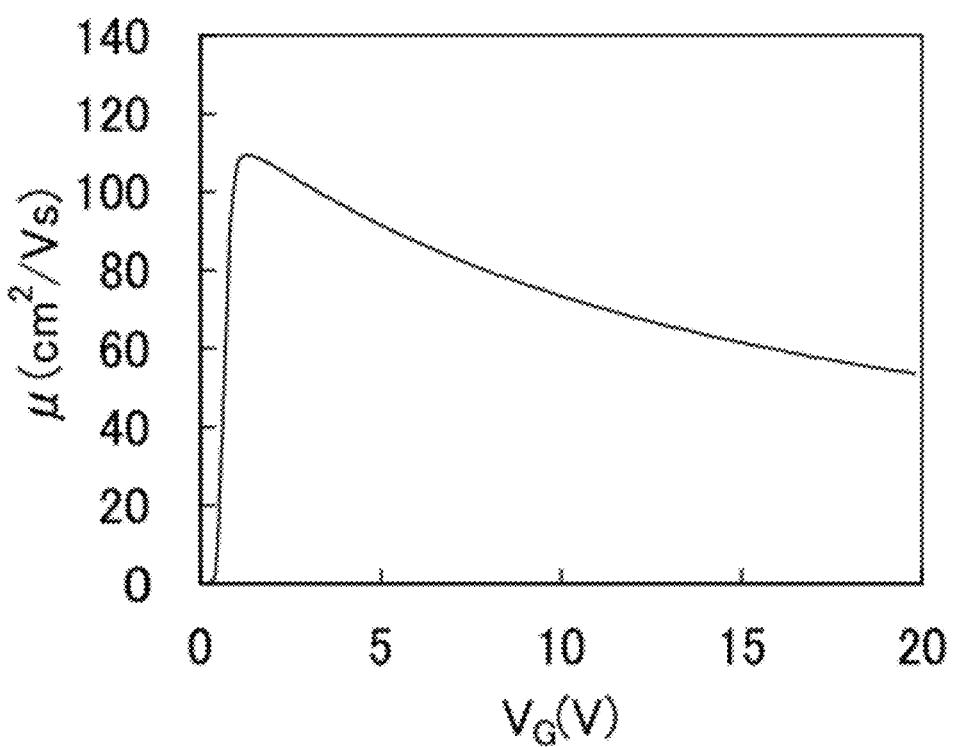
FIG. 15 shows gate voltage dependence of mobility obtained by calculation.

FIG. 15 shows calculation results of the mobility $\mu_2$ of a transistor whose channel is formed using an ideal oxide semiconductor without a defect inside the semiconductor. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 15, the mobility has a peak of 100 cm$^2$/Vs or more at a gate voltage that is a little over 1 V, and is decreased as the gate voltage becomes higher because the influence of interface scattering is increased. Note that in order to reduce interface scattering, it is desirable that a surface of the semiconductor film be flat at the atomic level (atomic layer flatness).

Calculation results of characteristics of minute transistors formed using an oxide semiconductor having such a mobility are shown in FIGS. 16A to 16C, FIGS. 17A to 17C, and FIGS. 18A to 18C. FIGS. 19A and 19B illustrate cross-sectional structures of the transistors used for the calculation. The transistors illustrated in FIGS. 19A and 19B each include a semiconductor region 2103a and a semiconductor region 2103c that have n$^+$-type conductivity in an oxide semiconductor film. The resistivity of the semiconductor regions 2103a and 2103c is $2\times10^{-3}$ Ωcm.

The transistor in FIG. 19A is formed over a base insulating film 2101 and an embedded insulator 2102 that is embedded in the base insulating film 2101 and formed of aluminum oxide. The transistor includes the semiconductor region 2103a, the semiconductor region 2103c, an intrinsic semiconductor region 2103b that is placed between the semiconductor regions 2103a and 2103c and serves as a channel formation region, and a gate 2105. The width of the gate 2105 is 33 nm.

A gate insulating film 2104 is formed between the gate 2105 and the semiconductor region 2103b. A sidewall insulator 2106a and a sidewall insulator 2106b are formed on both side surfaces of the gate 2105, and an insulator 2107 is formed over the gate 2105 so as to prevent a short circuit between the gate 2105 and another wiring. The sidewall insulator has a width of 5 nm. A source 2108a and a drain 2108b are provided in contact with the semiconductor region 2103a and the semiconductor region 2103c, respectively. Note that the channel width of this transistor is 40 nm.

The transistor in FIG. 19B is the same as the transistor in FIG. 19A in that it is formed over the base insulating film 2101 and the embedded insulator 2102 formed of aluminum oxide and that it includes the semiconductor region 2103a, the semiconductor region 2103c, the intrinsic semiconductor region 2103b provided therebetween, the gate 2105 having a width of 33 nm, the gate insulating film 2104, the sidewall insulator 2106a, the sidewall insulator 2106b, the insulator 2107, the source 2108a, and the drain 2108b.

The difference between the transistor in FIG. 19A and the transistor in FIG. 19B is the conductivity type of semiconductor regions under the sidewall insulators 2106a and 2106b. In the transistor in FIG. 19A, the semiconductor regions under the sidewall insulator 2106a and the sidewall insulator 2106b are part of the semiconductor region 2103a having n$^+$-type conductivity and part of the semiconductor region 2103c having n$^+$-type conductivity, whereas in the transistor in FIG. 19B, the semiconductor regions under the sidewall insulator 2106a and the sidewall insulator 2106b are part of the intrinsic semiconductor region 2103b. In other words, in the semiconductor layer of FIG. 19B, a region having a width of $L_{off}$ which overlaps with neither the semiconductor region 2103a (the semiconductor region 2103c) nor the gate 2105 is provided. This region is called an offset region, and the width $L_{off}$ is called an offset length. As is seen from the drawing, the offset length is equal to the width of the sidewall insulator 2106a (the sidewall insulator 2106b).

Figure 16A:
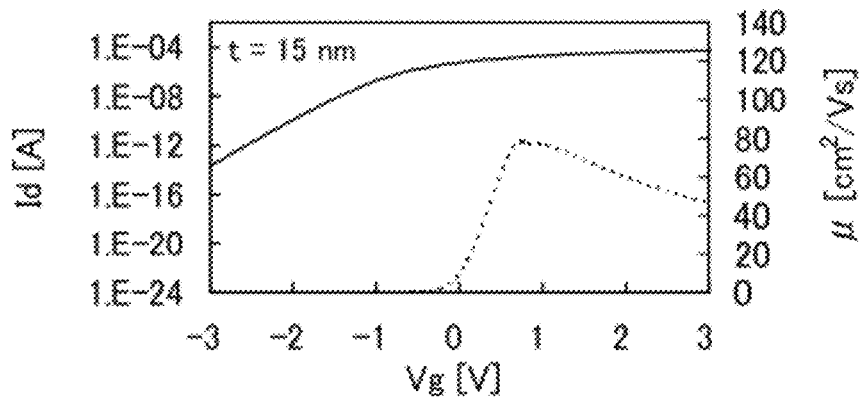
FIGS. 16A to 16C each show gate voltage dependence of drain current and mobility obtained by calculation.
Figure 16B:
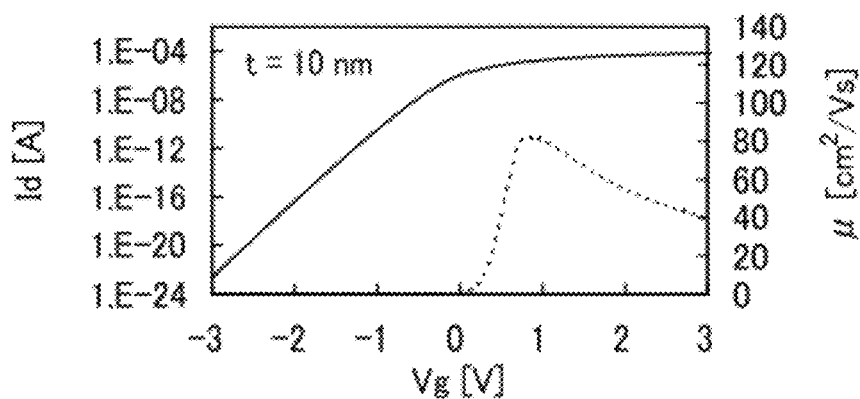
Figure 16C:
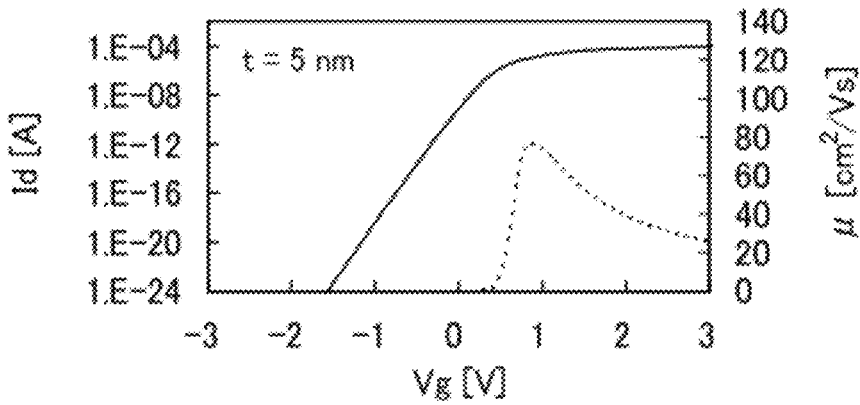

The other parameters used in calculation are as described above. For the calculation, device simulation software Sentaurus Device manufactured by Synopsys, Inc. was used. FIGS. 16A to 16C show the gate voltage ($V_g$: a potential difference between the gate and the source) dependence of the drain current ($I_d$, a solid line) and the mobility (μ, a dotted line) of the transistor having the structure illustrated in FIG. 19A. The drain current $I_d$ is obtained by calculation under the assumption that the drain voltage (a potential difference between the drain and the source) is +1 V, and the mobility μ is obtained by calculation under the assumption that the drain voltage is +0.1 V.

FIG. 16A shows the gate voltage dependence of the transistor in the case where the thickness of the gate insulating film is 15 nm, FIG. 16B shows that of the transistor in the case where the thickness of the gate insulating film is 10 nm, and FIG. 16C shows that of the transistor in the case where the thickness of the gate insulating film is 5 nm. As the gate insulating film is thinner, the drain current $I_d$ in an off state (the off-state current) in particular is significantly decreased. In contrast, there is no noticeable change in peak value of the mobility μ and the drain current $I_d$ in an on state (the on-state current). The graphs show that the drain current exceeds 10 μA, which is required in a memory element and the like, at a gate voltage of around 1 V.

Figure 17A:
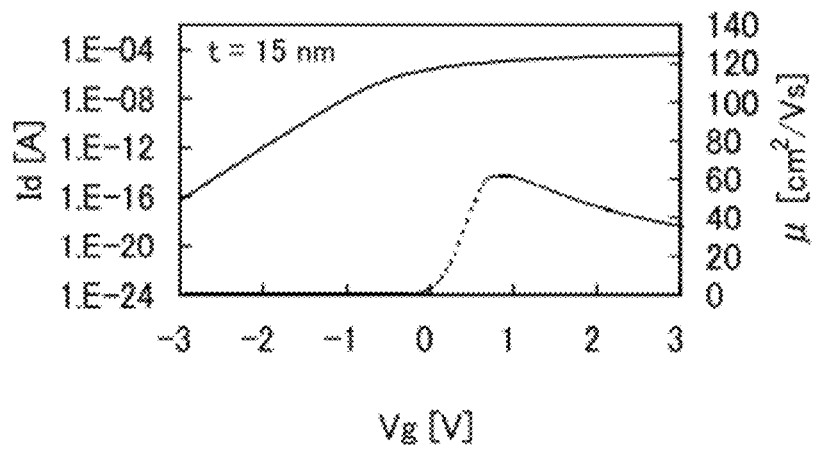
FIGS. 17A to 17C each show gate voltage dependence of drain current and mobility obtained by calculation.
Figure 17B:
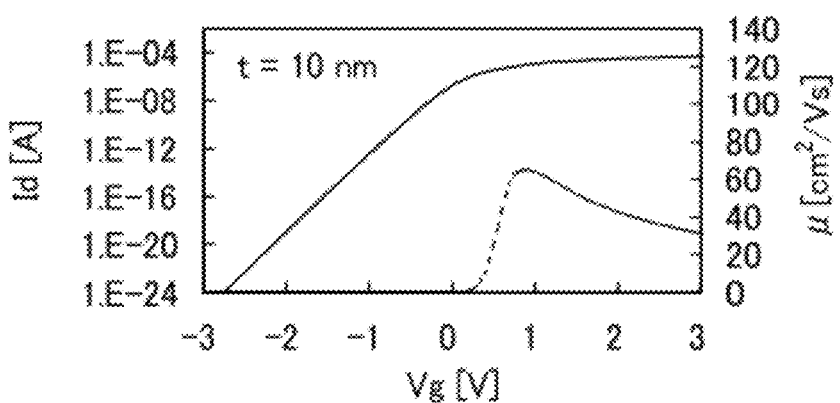
Figure 17C:
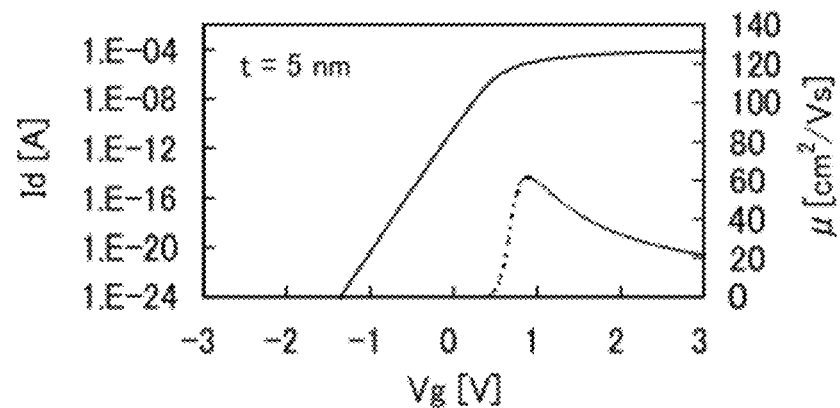

FIGS. 17A to 17C show the gate voltage $V_g$ dependence of the drain current $I_d$ (a solid line) and the mobility μ (a dotted line) of the transistor having the structure in FIG. 19B and an offset length $L_{off}$ of 5 nm. The drain current $I_d$ obtained by calculation under the assumption that the drain voltage is +1 V, and the mobility μ is obtained by calculation under the assumption that the drain voltage is +0.1 V. FIG. 17A shows the gate voltage dependence of the transistor in the case where the thickness of the gate insulating film is 15 nm, FIG. 17B shows that of the transistor in the case where the thickness of the gate insulating film is 10 nm, and FIG. 17C shows that of the transistor in the case where the thickness of the gate insulating film is 5 nm.

Figure 18A:
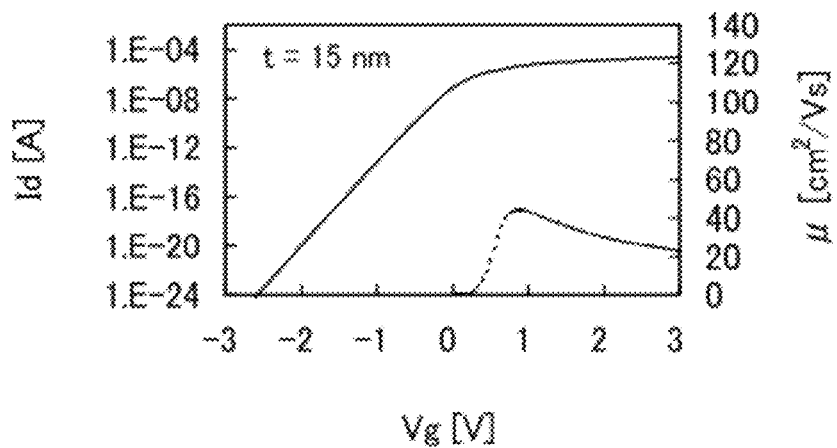
FIGS. 18A to 18C each show gate voltage dependence of drain current and mobility obtained by calculation.
Figure 18B:
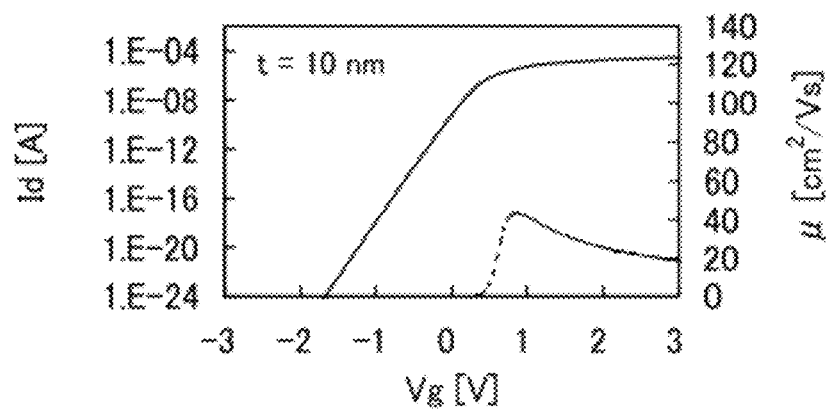
Figure 18C:
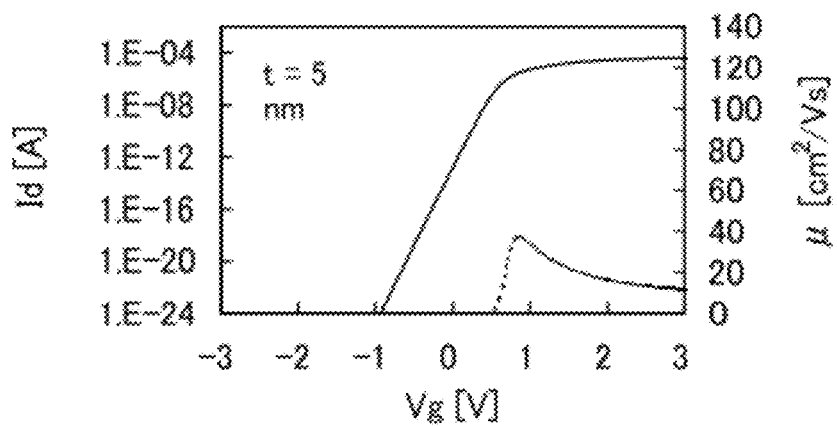
Figure 19A:
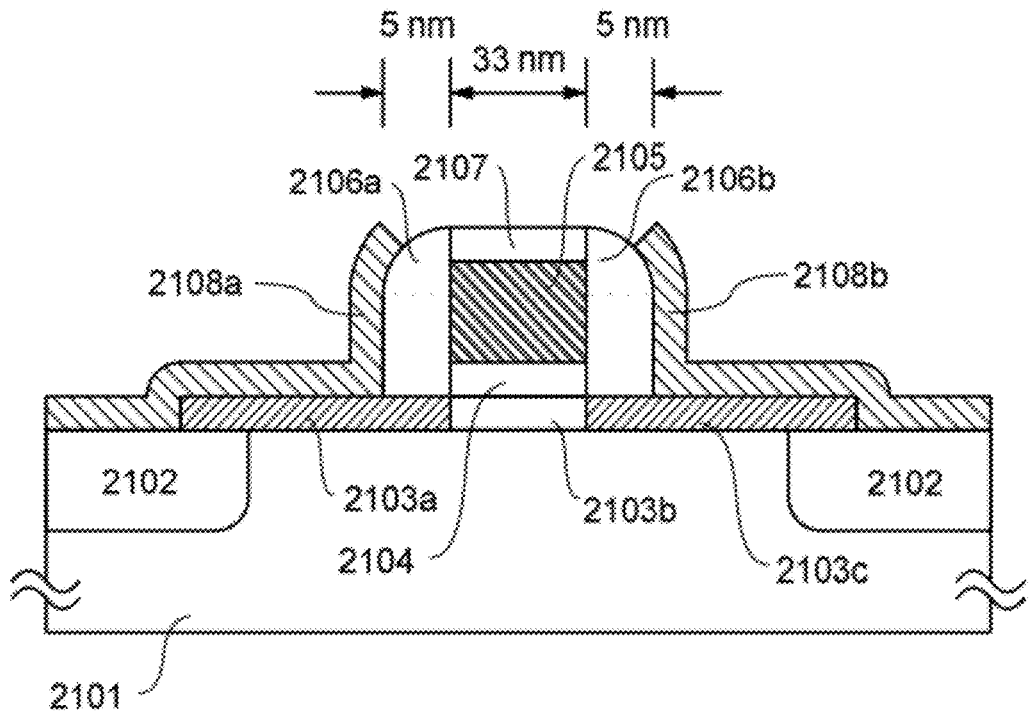
FIGS. 19A and 19B illustrate cross-sectional structures of transistors used for calculation.
Figure 19B:
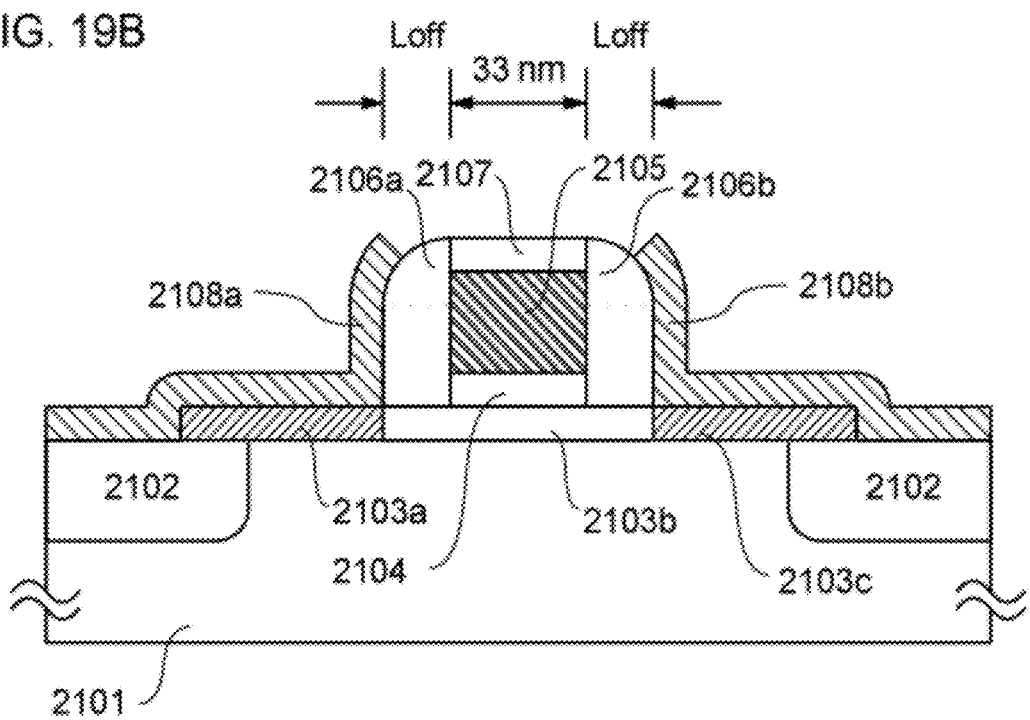

FIGS. 18A to 18C show the gate voltage dependence of the drain current $I_d$ (a solid line) and the mobility μ (a dotted line) of the transistor having the structure in FIG. 19B and an offset length $L_{off}$ of 15 nm. The drain current $I_d$ is obtained by calculation under the assumption that the drain voltage is +1 V, and the mobility μ is obtained by calculation under the assumption that the drain voltage is +0.1 V. FIG. 18A shows the gate voltage dependence of the transistor in the case where the thickness of the gate insulating film is 15 nm, FIG. 18B shows that of the transistor in the case where the thickness of the gate insulating film is 10 nm, and FIG. 18C shows that of the transistor in the case where the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 cm$^2$/Vs in FIGS. 16A to 16C, approximately 60 cm$^2$/Vs in FIGS. 17A to 17C, and approximately 40 cm$^2$/Vs in FIGS. 18A to 18C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

Example 1

A transistor in which an oxide semiconductor film containing In, Sn, and Zn as main components is used for a channel formation region can have favorable characteristics by depositing the oxide semiconductor film while heating a substrate or by performing heat treatment after the oxide semiconductor film is formed. Note that a main component refers to an element included in a composition at 5 atomic % or more.

By intentionally heating the substrate after formation of the oxide semiconductor film containing In, Sn, and Zn as main components, the field-effect mobility of the transistor can be improved. Further, the threshold voltage of the transistor can be positively shifted to make the transistor normally off.

Figure 20A:
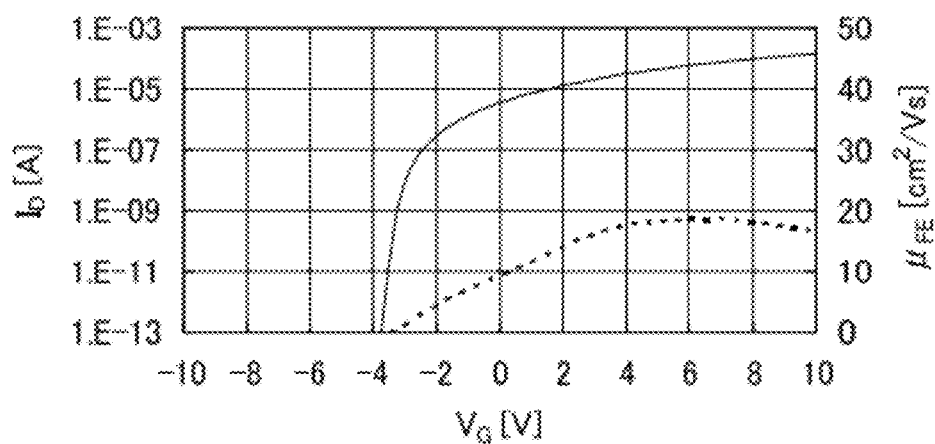
FIGS. 20A to 20C are graphs showing characteristics of transistors each including an oxide semiconductor film.
Figure 20B:
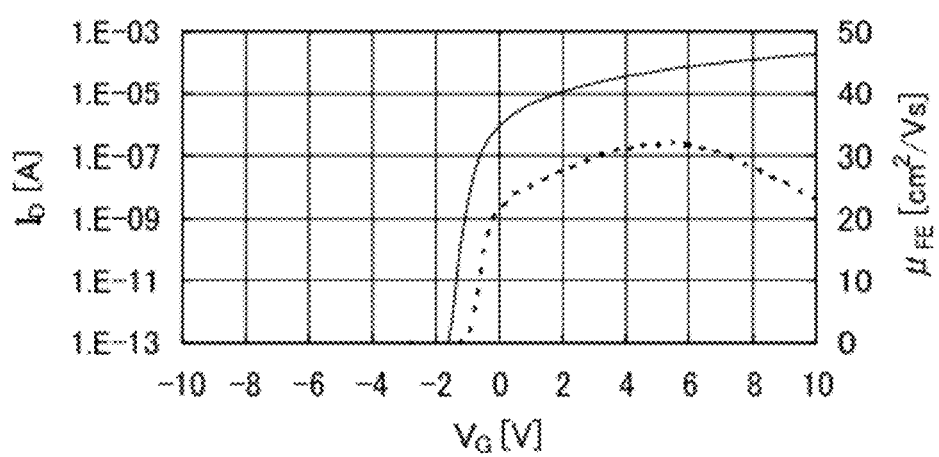
Figure 20C:
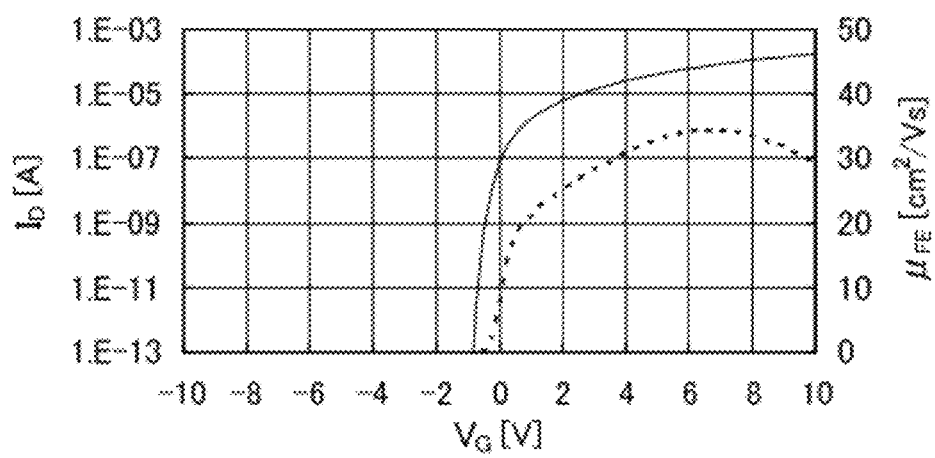

As an example, FIGS. 20A to 20C are graphs each showing characteristics of a transistor in which an oxide semiconductor film containing In, Sn, and Zn as main components and having a channel length L of 3 μm and a channel width W of 10 μm, and a gate insulating film with a thickness of 100 nm are used. Note that $V_d$ was set to 10 V.

FIG. 20A is a graph showing characteristics of a transistor whose oxide semiconductor film containing In, Sn, and Zn as main components was formed by a sputtering method without heating a substrate intentionally. The field-effect mobility of the transistor was 18.8 cm$^2$/Vsec. On the other hand, when the oxide semiconductor film containing In, Sn, and Zn as main components is formed while heating the substrate intentionally, the field-effect mobility can be improved. FIG. 20B shows characteristics of a transistor whose oxide semiconductor film containing In, Sn, and Zn as main components was formed while heating a substrate at 200° C. The field-effect mobility of the transistor was 32.2 cm$^2$/Vsec.

The field-effect mobility can be further improved by performing heat treatment after formation of the oxide semiconductor film containing In, Sn, and Zn as main components. FIG. 20C shows characteristics of a transistor whose oxide semiconductor film containing In, Sn, and Zn as main components was formed by sputtering at 200° C. and then subjected to heat treatment at 650° C. The field-effect mobility of the transistor was 34.5 cm$^2$/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. In addition, the oxide semiconductor can be crystallized by being highly purified by removal of impurities from the oxide semiconductor. In the case of using such a highly purified non-single-crystal oxide semiconductor, ideally, a field-effect mobility exceeding 100 cm$^2$/Vsec is expected to be realized.

The oxide semiconductor containing In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film which contains In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 20A and 20B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be achieved by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_d$ of 10 V. Note that $V_d$ refers to a drain voltage (a potential difference between the drain and the source). Then, the substrate temperature was set to 150° C. and $V_d$ was set to 0.1 V. After that, $V_g$ of 20 V was applied so that the intensity of an electric field applied to the gate insulating film was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, $V_g$ of −20 V was applied so that the intensity of an electric field applied to the gate insulating film was −2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 21A:
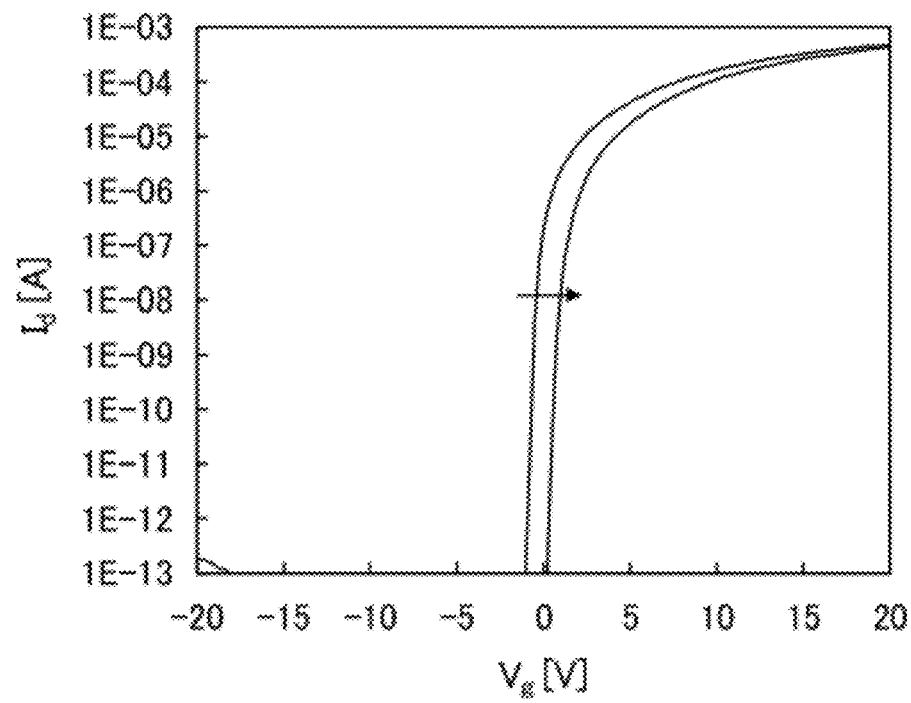
FIGS. 21A and 21B are graphs showing $V_g$-$I_d$ characteristics after a BT test of a transistor of Sample 1.
Figure 21B:
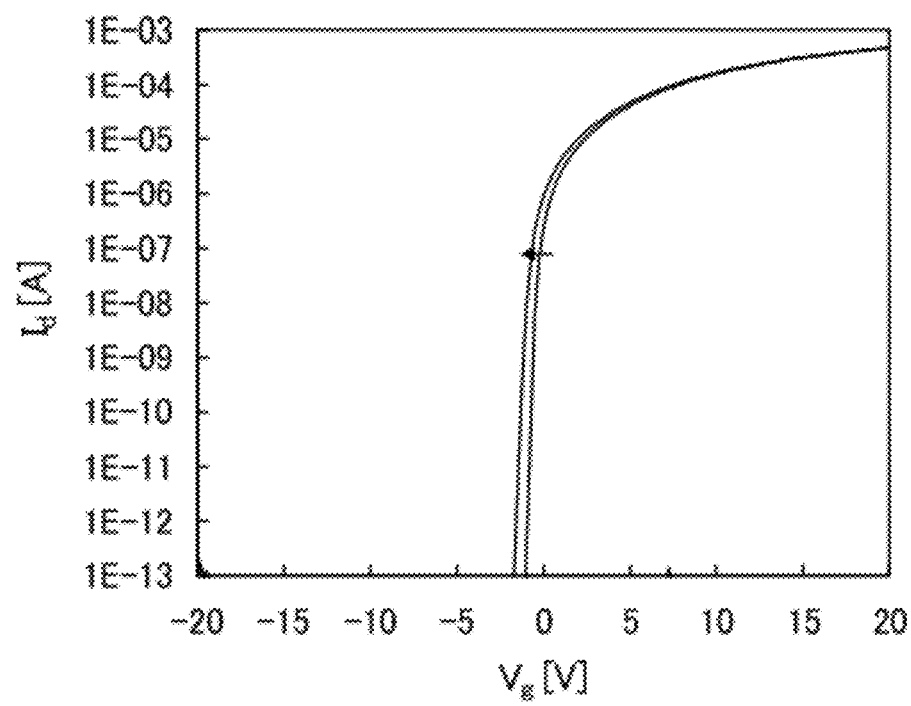
Figure 22A:
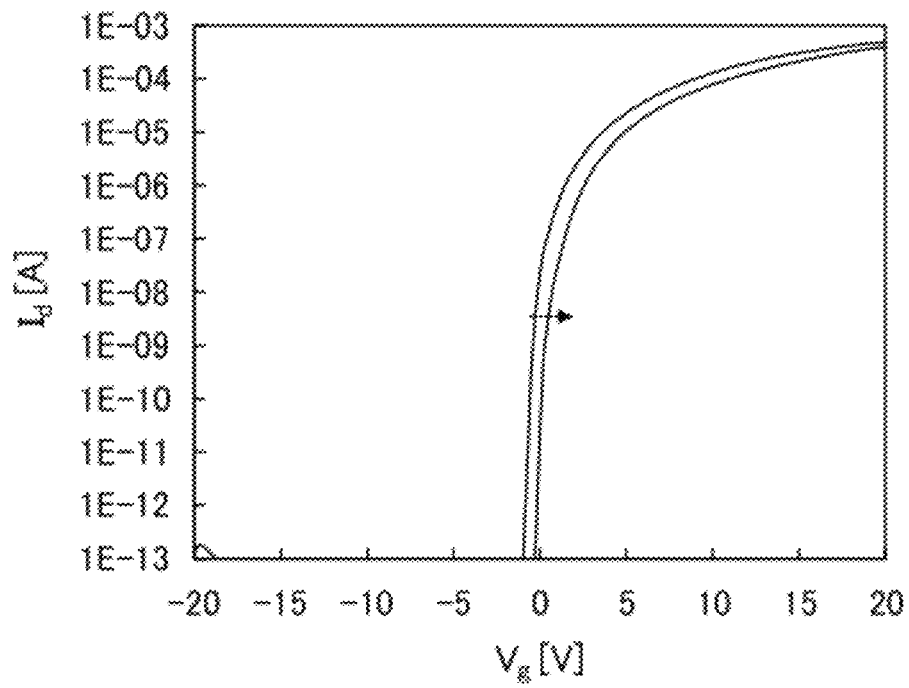
FIGS. 22A and 22B are graphs showing $V_g$-$I_d$ characteristics after a BT test of a transistor of Sample 2.
Figure 22B:
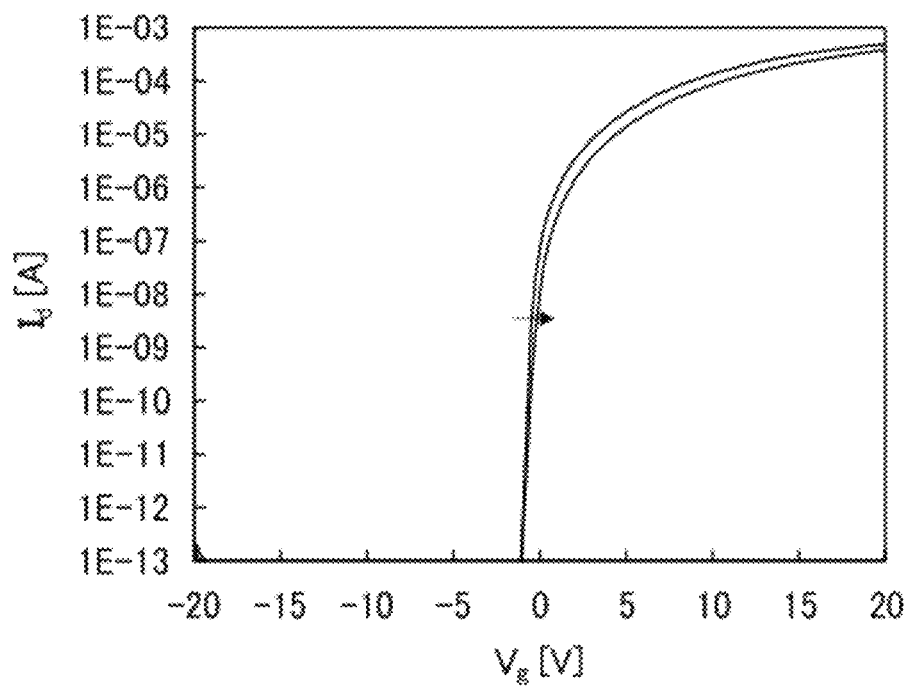

FIGS. 21A and 21B show results of the positive BT test and the negative BT test, respectively, of Sample 1. FIGS. 22A and 22B show results of the positive BT test and the negative BT test, respectively, of Sample 2.

The amount of shift in threshold voltage of Sample 1 due to the positive BT test and that due to the negative BT test were 1.80 V and −0.42 V, respectively. The amount of shift in threshold voltage of Sample 2 due to the positive BT test and that due to the negative BT test were 0.79 V and 0.76 V, respectively. It is found that, in each of Sample 1 and Sample 2, the amount of shift in threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby the effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is mainly oxygen existing between lattices. When the concentration of oxygen is set in the range of $1\times10^{16}/cm^3$ to $2\times10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed with X-ray diffraction.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 23:
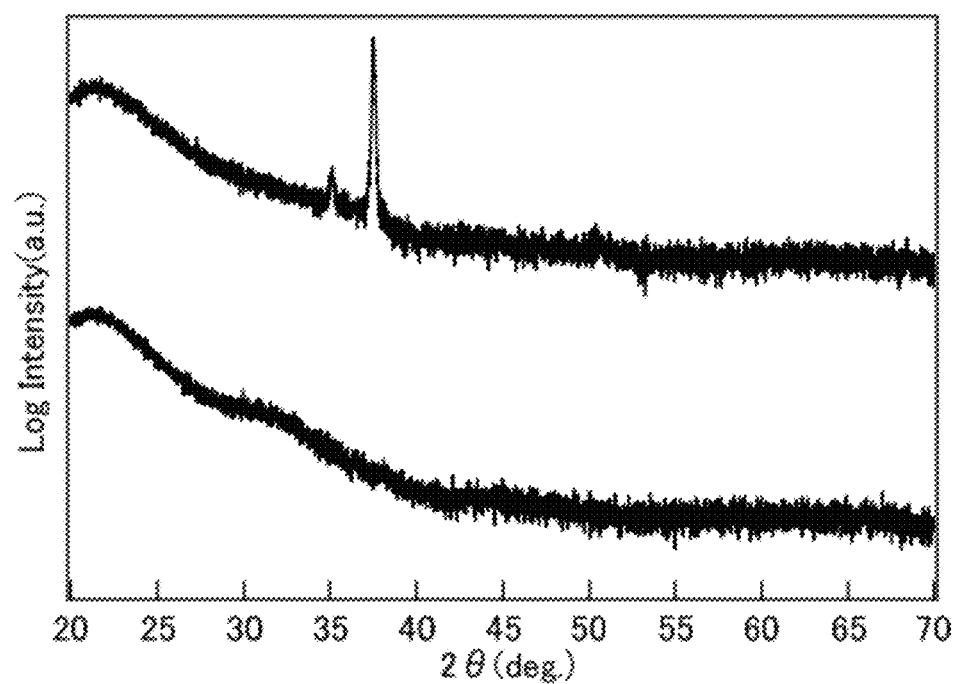
FIG. 23 shows XRD spectra of Sample A and Sample B.

FIG. 23 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor containing In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 24:
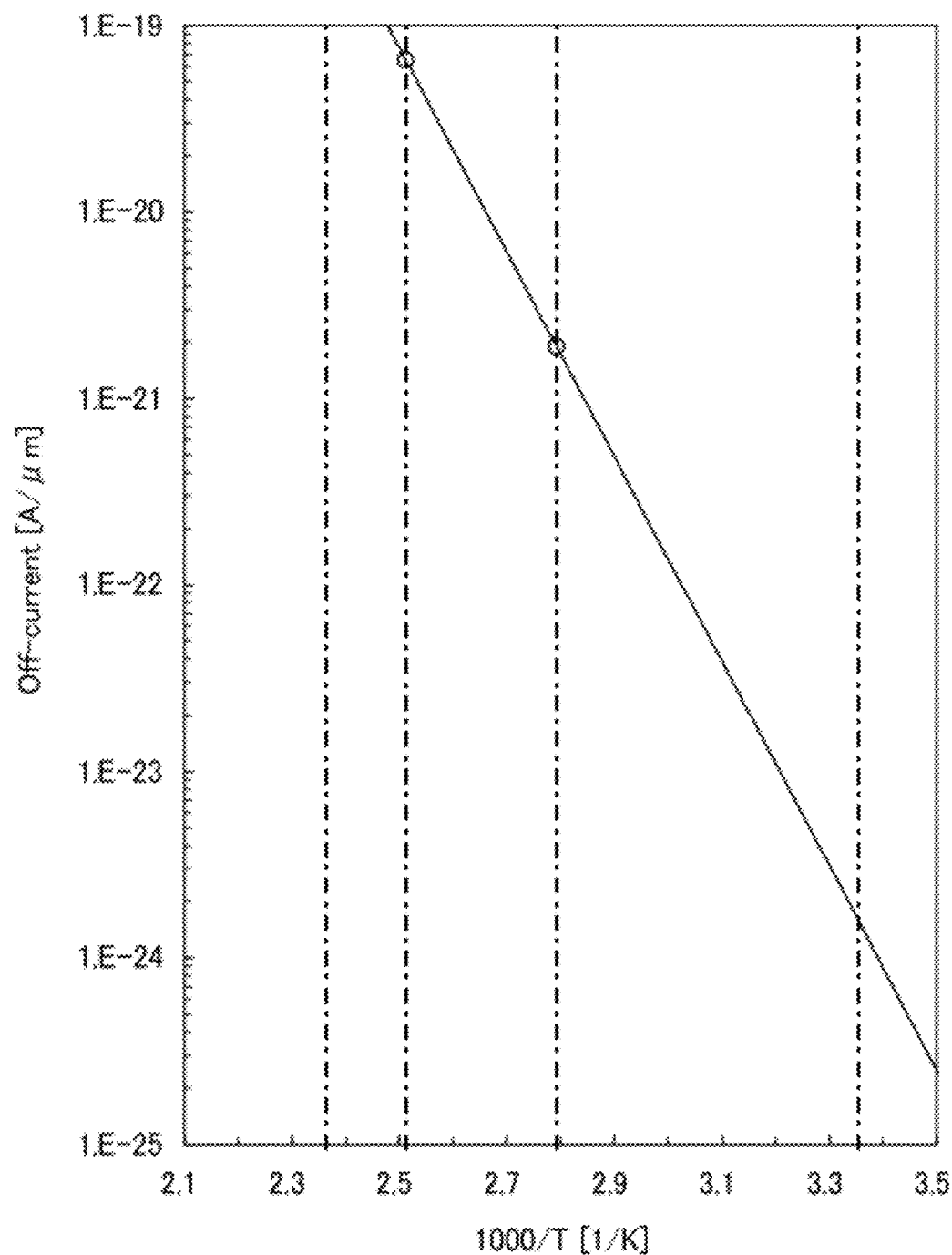
FIG. 24 is a graph showing a relation between off-state current and substrate temperature in measurement of a transistor.

FIG. 24 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 24, the off-state current can be 1 aA/μm ($1\times10^{-18}$ A/μm) or lower, 100 zA/μm ($1\times10^{-19}$ A/μm) or lower, and 1 zA/μm ($1\times10^{-21}$ A/μm) or lower when the substrate temperature is 125° C., 85° C., and room temperature (27° C.), respectively. Preferably, the off-state current can be 0.1 aA/μm ($1\times10^{-19}$ A/μm) or lower, 10 zA/μm ($1\times10^{-20}$ A/μm) or lower, and 0.1 zA/μm ($1\times10^{-22}$ A/μm) or lower at 125° C., 85° C., and room temperature, respectively. The above values of off-state currents are clearly much lower than that of the transistor using Si as a semiconductor film.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor containing In, Sn, and Zn as main components by heat treatment, a film which does not include moisture originally is preferably formed because moisture is released from the oxide semiconductor containing In, Sn, and Zn as main components at a higher temperature than from an oxide semiconductor containing In, Ga, and Zn as main components.

The relation between the substrate temperature and electrical characteristics of a transistor of Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_d$ was set to 10V. Note that the substrate temperature was −40° C., −25° C., 25° C., 75° C., 125° C., and 150° C. Here, in the transistor, the width of a portion where a gate electrode overlaps with one of a pair of electrodes is referred to as Lov, and the width of a portion of the pair of electrodes, which does not overlap with an oxide semiconductor film, is referred to as dW.

Figure 25:
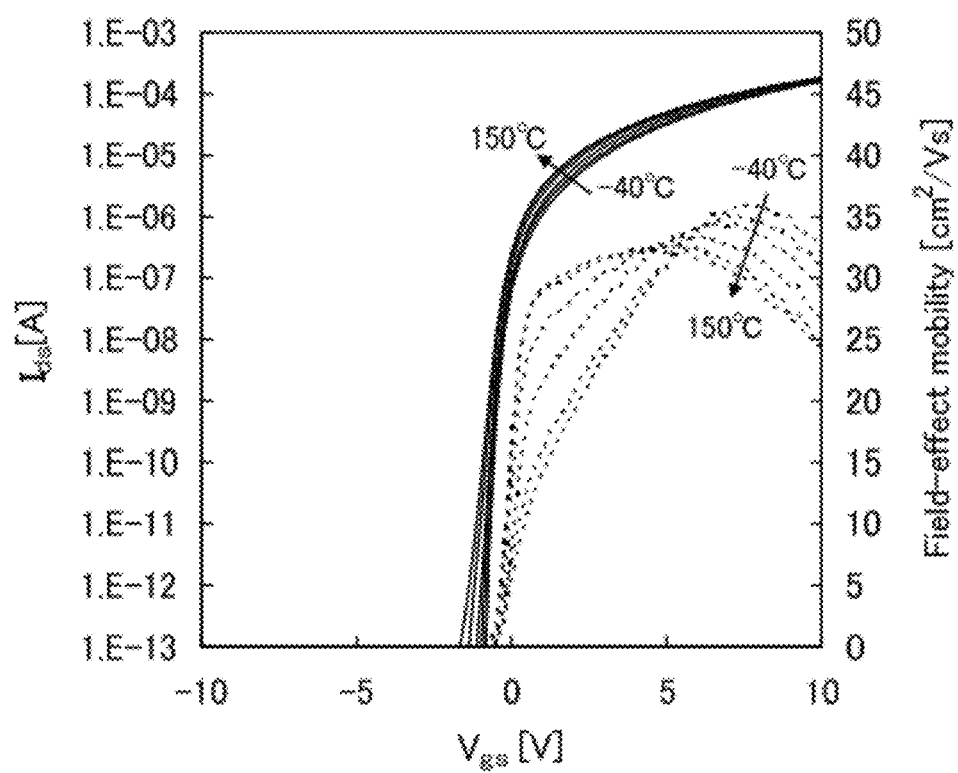
FIG. 25 is a graph showing $V_g$ dependence of $I_d$ and field-effect mobility.
Figure 26A:
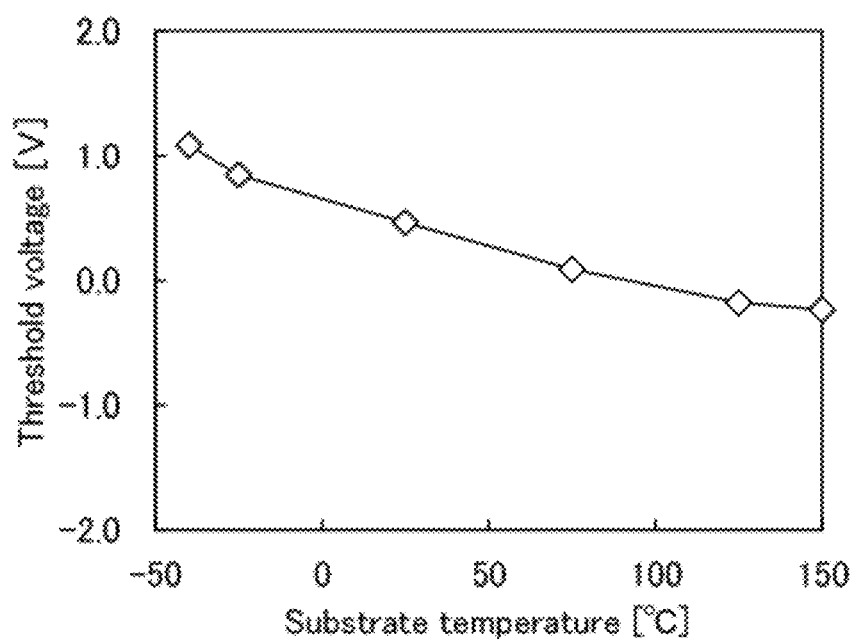
FIG. 26A shows a relation between substrate temperature and threshold voltage.

FIG. 25 shows the $V_g$ dependence of $I_d$ (a solid line) and field-effect mobility (a dotted line). FIG. 26A shows a relation between the substrate temperature and the threshold voltage, and FIG. 26B shows a relation between the substrate temperature and the field-effect mobility.

From FIG. 26A, it is found that the threshold voltage gets lower as the substrate temperature increases. Note that the threshold voltage is decreased from 1.09 V to −0.23 V in the range from −40° C. to 150° C.

Figure 26B:
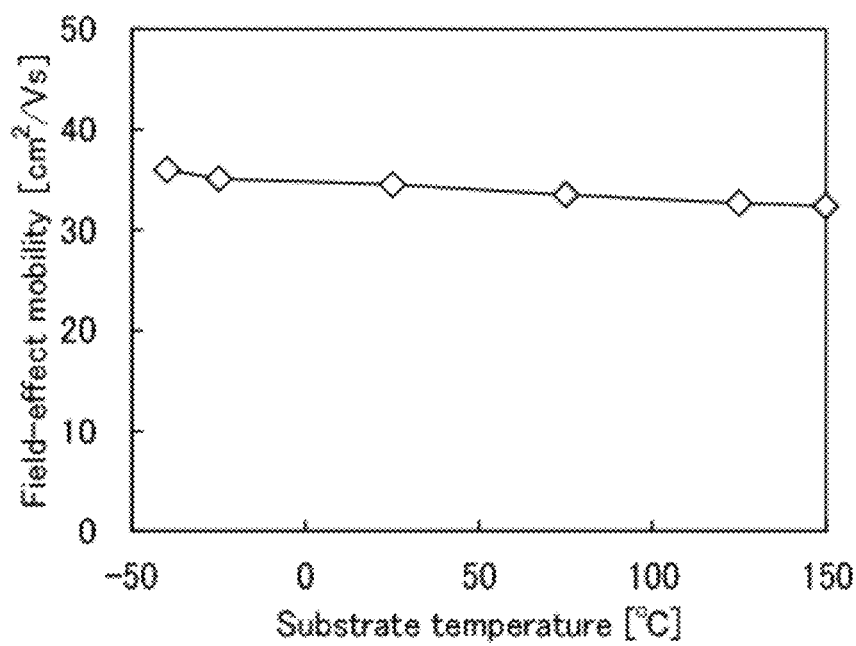
FIG. 26B shows a relation between substrate temperature and field-effect mobility.

From FIG. 26B, it is found that the field-effect mobility gets lower as the substrate temperature increases. Note that the field-effect mobility is decreased from 36 $cm^2/Vs$ to 32 $cm^2/Vs$ in the range from −40° C. to 150° C. Thus, it is found that variation in electrical characteristics is small in the above temperature range.

In a transistor in which such an oxide semiconductor containing In, Sn, and Zn as main components is used as a channel formation region, a field-effect mobility of 30 $cm^2/Vsec$ or higher, preferably 40 $cm^2/Vsec$ or higher, further preferably 60 $cm^2/Vsec$ or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electrical characteristics can be ensured in a temperature range needed for operation of a transistor. With such characteristics, an integrated circuit having a novel function can be realized without decreasing the operation speed even when a transistor including an oxide semiconductor is provided in an integrated circuit formed using a Si semiconductor.

Example 2

In this example, an example of a transistor in which an In—Sn—Zn—O film is used as an oxide semiconductor film will be described with reference to FIGS. 27A and 27B and the like.

Figure 27A:
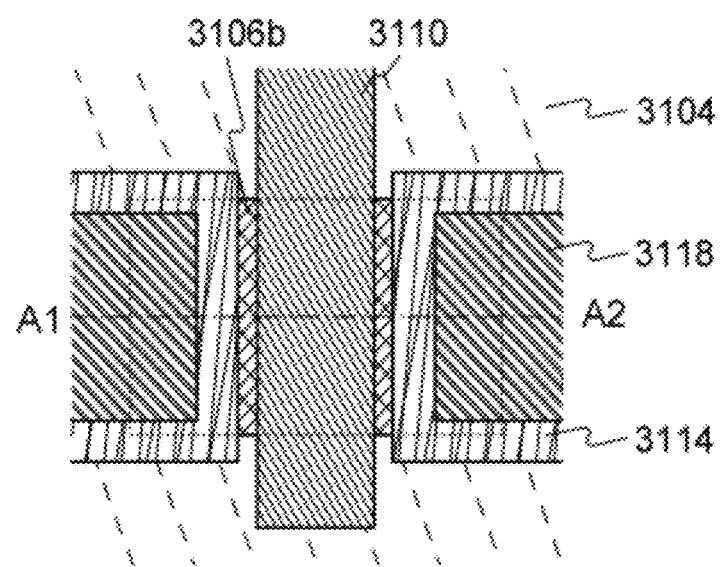
FIG. 27A is a top view of a semiconductor device.
Figure 27B:
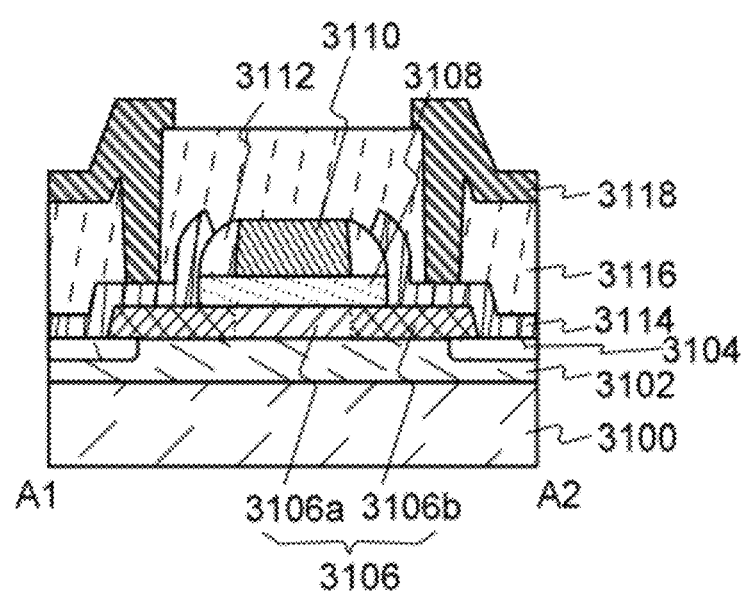
FIG. 27B is a cross-sectional view thereof.

FIGS. 27A and 27B are a top view and a cross-sectional view of a coplanar transistor having a top-gate top-contact structure. FIG. 27A is the top view of the transistor. FIG. 27B illustrates cross section A1-A2 along dashed-dotted line A1-A2 in FIG. 27A.

The transistor illustrated in FIG. 27B includes a substrate 3100; a base insulating film 3102 provided over the substrate 3100; a protective insulating film 3104 provided in the periphery of the base insulating film 3102; an oxide semiconductor film 3106 which is provided over the base insulating film 3102 and the protective insulating film 3104 and includes a high-resistance region 3106a and low-resistance regions 3106b; a gate insulating film 3108 provided over the oxide semiconductor film 3106; a gate electrode 3110 provided to overlap with the oxide semiconductor film 3106 with the gate insulating film 3108 positioned therebetween; a sidewall insulating film 3112 provided in contact with a side surface of the gate electrode 3110; a pair of electrodes 3114 provided in contact with at least the low-resistance regions 3106b; an interlayer insulating film 3116 provided to cover at least the oxide semiconductor film 3106, the gate electrode 3110, and the pair of electrodes 3114; and a wiring 3118 provided to be connected to at least one of the pair of electrodes 3114 through an opening formed in the interlayer insulating film 3116.

Although not illustrated, a protective film may be provided to cover the interlayer insulating film 3116 and the wiring 3118. With the protective film, a minute amount of leakage current generated by surface conduction of the interlayer insulating film 3116 can be reduced and thus the off-state current of the transistor can be reduced.

Example 3

In this example, another example of a transistor in which an In—Sn—Zn—O film is used as an oxide semiconductor film will be described.

Figure 28A:
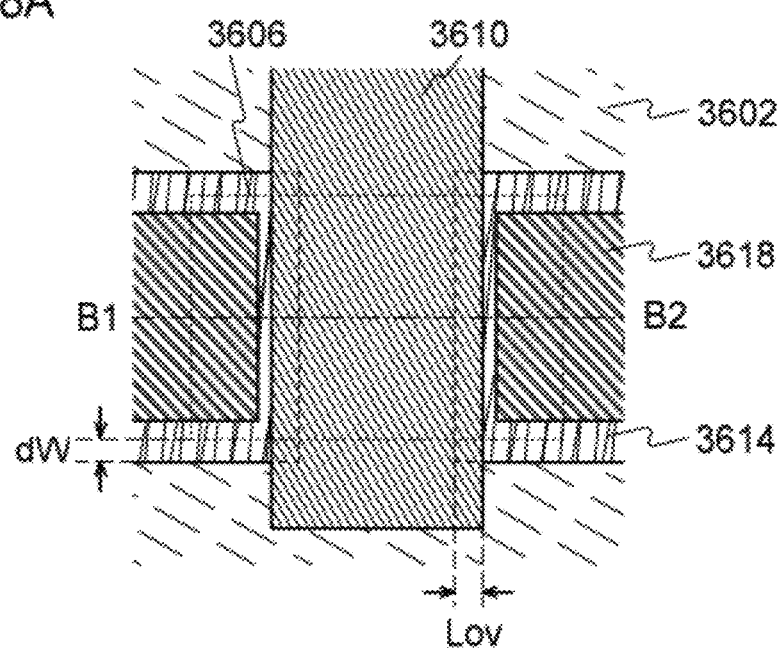
FIG. 28A is a top view of a semiconductor device.
Figure 28B:
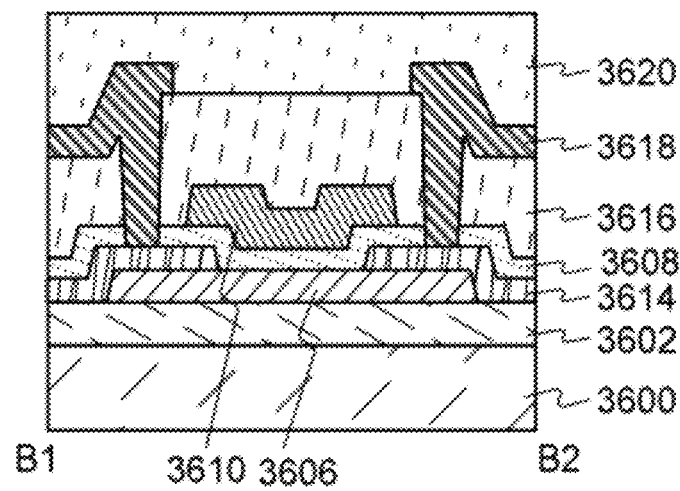
FIG. 28B is a cross-sectional view thereof.

FIGS. 28A and 28B are a top view and a cross-sectional view which illustrate a structure of a transistor manufactured in this example. FIG. 28A is the top view of the transistor. FIG. 28B is the cross-sectional view along dashed-dotted line B1-B2 in FIG. 28A.

The transistor illustrated in FIG. 28B includes a substrate 3600; a base insulating film 3602 provided over the substrate 3600; an oxide semiconductor film 3606 provided over the base insulating film 3602; a pair of electrodes 3614 in contact with the oxide semiconductor film 3606; a gate insulating film 3608 provided over the oxide semiconductor film 3606 and the pair of electrodes 3614; a gate electrode 3610 provided to overlap with the oxide semiconductor film 3606 with the gate insulating film 3608 positioned therebetween; an interlayer insulating film 3616 provided to cover the gate insulating film 3608 and the gate electrode 3610; wirings 3618 connected to the pair of electrodes 3614 through openings formed in the interlayer insulating film 3616; and a protective film 3620 provided to cover the interlayer insulating film 3616 and the wirings 3618.

As the substrate 3600, a glass substrate can be used. As the base insulating film 3602, a silicon oxide film can be used. As the oxide semiconductor film 3606, an In—Sn—Zn—O film can be used. As the pair of electrodes 3614, a tungsten film can be used. As the gate insulating film 3608, a silicon oxide film can be used. The gate electrode 3610 can have a stacked structure of a tantalum nitride film and a tungsten film. The interlayer insulating film 3616 can have a stacked structure of a silicon oxynitride film and a polyimide film. The wirings 3618 can each have a stacked structure in which a titanium film, an aluminum film, and a titanium film are formed in this order. As the protective film 3620, a polyimide film can be used.

Note that in the transistor having the structure illustrated in FIG. 28A, the width of a portion where the gate electrode 3610 overlaps with one of the pair of electrodes 3614 is referred to as Lov. Similarly, the width of a portion of the pair of electrodes 3614, which does not overlap with the oxide semiconductor film 3606, is referred to as dW.

This application is based on Japanese Patent Application Serial No. 2011-096609 filed with Japan Patent Office on Apr. 22, 2011, and Japanese Patent Application Serial No. 2011-112693 filed with Japan Patent Office on May 19, 2011, the entire contents of which are hereby incorporated by reference.

What is claimed is:

1. A memory element comprising:
a first selection circuit configured to output a first data signal in response to a first control signal;
a second selection circuit configured to output a second data signal that is an inverted signal of the first data signal in response to the first control signal;
a latch circuit to which the first data signal and the second data signal are configured to be input, and which is configured to hold the first data signal and the second data signal;
a first nonvolatile memory circuit to which the first data signal held in the latch circuit is configured to be input in response to a second control signal; and
a second nonvolatile memory circuit to which the second data signal held in the latch circuit is configured to be input in response to the second control signal,
wherein the first nonvolatile memory circuit comprises a first transistor and a first capacitor,
wherein a first electrode of the first capacitor is electrically connected to the first transistor,
wherein a second electrode of the first capacitor is electrically connected to a power supply line,
wherein the second nonvolatile memory circuit comprises a second transistor and a second capacitor,
wherein a first electrode of the second capacitor is electrically connected to the second transistor,
wherein a second electrode of the second capacitor is electrically connected to the power supply line,
wherein the power supply line is supplied with constant potential,
wherein each channel formation region of the first transistor and the second transistor is formed in an oxide semiconductor film,
wherein a channel formation region of at least one transistor in the latch circuit is formed in a single crystal silicon, and
wherein the first transistor and the second transistor are provided above the latch circuit.

2. The memory element according to claim 1,
wherein a channel formation region of at least one transistor in the first selection circuit and the second selection circuit is formed in a semiconductor other than an oxide semiconductor.

3. A memory device comprising the memory element according to claim 1.

4. The memory element according to claim 1,
wherein the memory element is configured to lower the first control signal from VDD to VSS after lowering the second control signal from VDD to VSS, and
wherein the memory element is configured to raise the first control signal from the VSS to the VDD after raising the second control signal from the VSS to the VDD.

5. A memory element comprising:
a first selection circuit configured to output a first data signal in response to a first control signal;
a second selection circuit configured to output a second data signal that is an inverted signal of the first data signal in response to the first control signal;
a latch circuit to which the first data signal and the second data signal are configured to be input, and which is configured to hold the first data signal and the second data signal only in a period during which a power supply voltage is supplied;
a first nonvolatile memory circuit to which the first data signal held in the latch circuit is configured to be input in response to a second control signal; and
a second nonvolatile memory circuit to which the second data signal held in the latch circuit is configured to be input in response to the second control signal,
wherein the first nonvolatile memory circuit holds the first data signal and the second nonvolatile memory circuit holds the second data signal even after supply of the power supply voltage is stopped,
wherein the first nonvolatile memory circuit comprises a first transistor and a first capacitor,
wherein a first electrode of the first capacitor is electrically connected to the first transistor,
wherein a second electrode of the first capacitor is electrically connected to a power supply line,
wherein the second nonvolatile memory circuit comprises a second transistor and a second capacitor,
wherein a first electrode of the second capacitor is electrically connected to the second transistor,
wherein a second electrode of the second capacitor is electrically connected to the power supply line,
wherein the power supply line is supplied with constant potential,
wherein each channel formation region of the first transistor and the second transistor is formed in an oxide semiconductor film,
wherein a channel formation region of at least one transistor in the latch circuit is formed in a single crystal silicon, and
wherein the first transistor and the second transistor are provided above the latch circuit.

6. The memory element according to claim 5,
wherein a channel formation region of at least one transistor in the first selection circuit and the second selection circuit is formed in a semiconductor other than an oxide semiconductor.

7. A memory device comprising the memory element according to claim 5.

8. The memory element according to claim 4,
wherein the memory element is configured to lower the first control signal from VDD to VSS after lowering the second control signal from VDD to VSS, and wherein the memory element is configured to raise the first control signal from the VSS to the VDD after raising the second control signal from the VSS to the VDD.

* * * * *